(12) United States Patent
Vasyltsov et al.

(10) Patent No.: US 10,818,347 B2
(45) Date of Patent: Oct. 27, 2020

(54) SEMICONDUCTOR MEMORY DEVICE FOR SUPPORTING OPERATION OF NEURAL NETWORK AND OPERATING METHOD OF SEMICONDUCTOR MEMORY DEVICE

(71) Applicant: SAMSUNG ELECTRONICS CO., LTD., Suwon-si (KR)

(72) Inventors: Ihor Vasyltsov, Yongin-si (KR); Youngnam Hwang, Hwaseong-si (KR); Jinmin Kim, Seoul (KR); Yongha Park, Seongnam-si (KR); Hyunsik Park, Seoul (KR); Jaewon Yang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/421,855

(22) Filed: May 24, 2019

(65) Prior Publication Data
US 2020/0168271 A1 May 28, 2020

(30) Foreign Application Priority Data
Nov. 28, 2018 (KR) .................. 10-2018-0149983

(51) Int. Cl.
| | |
|---|---|
| *G11C 11/54* | (2006.01) |
| *G11C 11/408* | (2006.01) |
| *G11C 11/4091* | (2006.01) |
| *G11C 11/4096* | (2006.01) |
| *G06N 3/04* | (2006.01) |

(52) U.S. Cl.
CPC ................ *G11C 11/54* (2013.01); *G06N 3/04* (2013.01); *G11C 11/4087* (2013.01); *G11C 11/4091* (2013.01); *G11C 11/4096* (2013.01)

(58) Field of Classification Search
CPC . G11C 11/54; G11C 11/4096; G11C 11/4087; G11C 11/4091; G06N 3/04
See application file for complete search history.

(56) References Cited

U.S. PATENT DOCUMENTS

| | | | |
|---|---|---|---|
| 6,731,526 B2 | 5/2004 | Inoue | |
| 6,738,283 B2 | 5/2004 | Kasai et al. | |
| 7,019,674 B2 | 3/2006 | Cadambi et al. | |
| 7,233,512 B2 | 6/2007 | Lysinger et al. | |
| 7,660,170 B2 * | 2/2010 | Jo ........................ | G11C 7/1051 365/189.05 |
| 9,997,232 B2 | 6/2018 | Murphy | |
| 10,090,041 B2 | 10/2018 | Hush | |

(Continued)

FOREIGN PATENT DOCUMENTS

| | | |
|---|---|---|
| JP | 2003-123482 A | 4/2003 |
| JP | 2003-272386 A | 9/2003 |
| KR | 10-0489420 B1 | 5/2005 |

*Primary Examiner* — Gene N Auduong
(74) *Attorney, Agent, or Firm* — Sughrue Mion, PLLC

(57) ABSTRACT

A semiconductor memory device includes a memory cell array including first memory cells and second memory cell, and a peripheral circuit. When a first command, a first address, and first input data are received, the peripheral circuit reads first data from the first memory cells based on the first address in response to the first command, performs a first operation by using the first data and the first input data, and reads second data from the second memory cells by using a result of the first operation.

18 Claims, 19 Drawing Sheets

(56) References Cited

U.S. PATENT DOCUMENTS

| | | | |
|---|---|---|---|
| 2004/0032769 A1* | 2/2004 | Takahashi | G11C 11/419 365/200 |
| 2004/0047221 A1* | 3/2004 | Tanaka | G11C 11/406 365/222 |
| 2009/0213659 A1* | 8/2009 | Lee | G11C 16/32 365/185.18 |
| 2016/0267016 A1* | 9/2016 | Lee | G06F 9/455 |
| 2016/0379115 A1 | 12/2016 | Burger et al. | |
| 2017/0103311 A1 | 4/2017 | Henry et al. | |
| 2017/0323041 A1 | 11/2017 | Zhang | |
| 2017/0323042 A1 | 11/2017 | Zhang | |
| 2018/0046907 A1 | 2/2018 | Ross et al. | |

\* cited by examiner

SEMICONDUCTOR MEMORY DEVICE FOR SUPPORTING OPERATION OF NEURAL NETWORK AND OPERATING METHOD OF SEMICONDUCTOR MEMORY DEVICE

CROSS-REFERENCE TO THE RELATED APPLICATION

This application claims priority from Korean Patent Application No. 10-2018-0149983 filed on Nov. 28, 2018, in the Korean Intellectual Property Office, the disclosures of which are incorporated by reference herein in their entireties.

BACKGROUND

Embodiments of the inventive concept relate to a semiconductor circuit, and more particularly, relate to a semiconductor memory device reducing consumption of resources by supporting an operation of a neural network and an operating method of the semiconductor memory device.

As technologies based on machine learning such as a neural network develop, there is an attempt to apply the machine learning to real life. However, because the use of the machine learning requires a huge operation quantity and a large amount of resources, it is problematic to provide a machine learning-based service to individual consumers.

Nowadays, there is an attempt to replace components of a computing device being widely used in real life with new components supporting the machine learning. For example, in the case where the components of the computing device support operations associated with the machine learning, the operations associated with the machine learning may be distributed over the components or may be performed in parallel.

SUMMARY

Various embodiments of the inventive concept provide a semiconductor memory device supporting machine learning-based operations while minimizing traffic associated with data communication with an external device and an operating method of the semiconductor memory device.

According to an exemplary embodiment, a semiconductor memory device includes a memory cell array including first memory cells and second memory cell, and a peripheral circuit. When a first command, a first address, and first input data are received, the peripheral circuit reads first data from the first memory cells based on the first address in response to the first command, performs a first operation by using the first data and the first input data, and reads second data from the second memory cells by using a result of the first operation.

According to an exemplary embodiment, a semiconductor memory device includes a memory cell array including first memory cells and second memory cells, a row decoder block connected with the memory cell array through word lines, a write and sense block connected to the memory cell array through bit lines, and an operation block. When a first command, a first address, and first input data are received, in response to the first command, the row decoder block and the write and sense block read first data from the first memory cells based on the first address. The operation block applies the first data to the first input data to output third data. When a second command is received, in response to the second command, the row decoder block and the write and sense block read second data from the second memory cells based on the third data.

According to an exemplary embodiment, an operating method of a semiconductor memory device which includes first memory cells and second memory cells includes receiving a first command, a first address, and first input data, reading first data from the first memory cells based on the first address, in response to the first command, performing an operation on the first data and the first input data, and reading second data from the second memory cells based on a result of the operation.

BRIEF DESCRIPTION OF THE DRAWINGS

The above and other objects and features of the inventive concept will become apparent by describing in detail exemplary embodiments thereof with reference to the accompanying drawings.

DETAILED DESCRIPTION

The embodiments described herebelow are all exemplary, and described in detail and clearly to such an extent that an ordinary one in the art easily implements the inventive concept.

Figure 1:
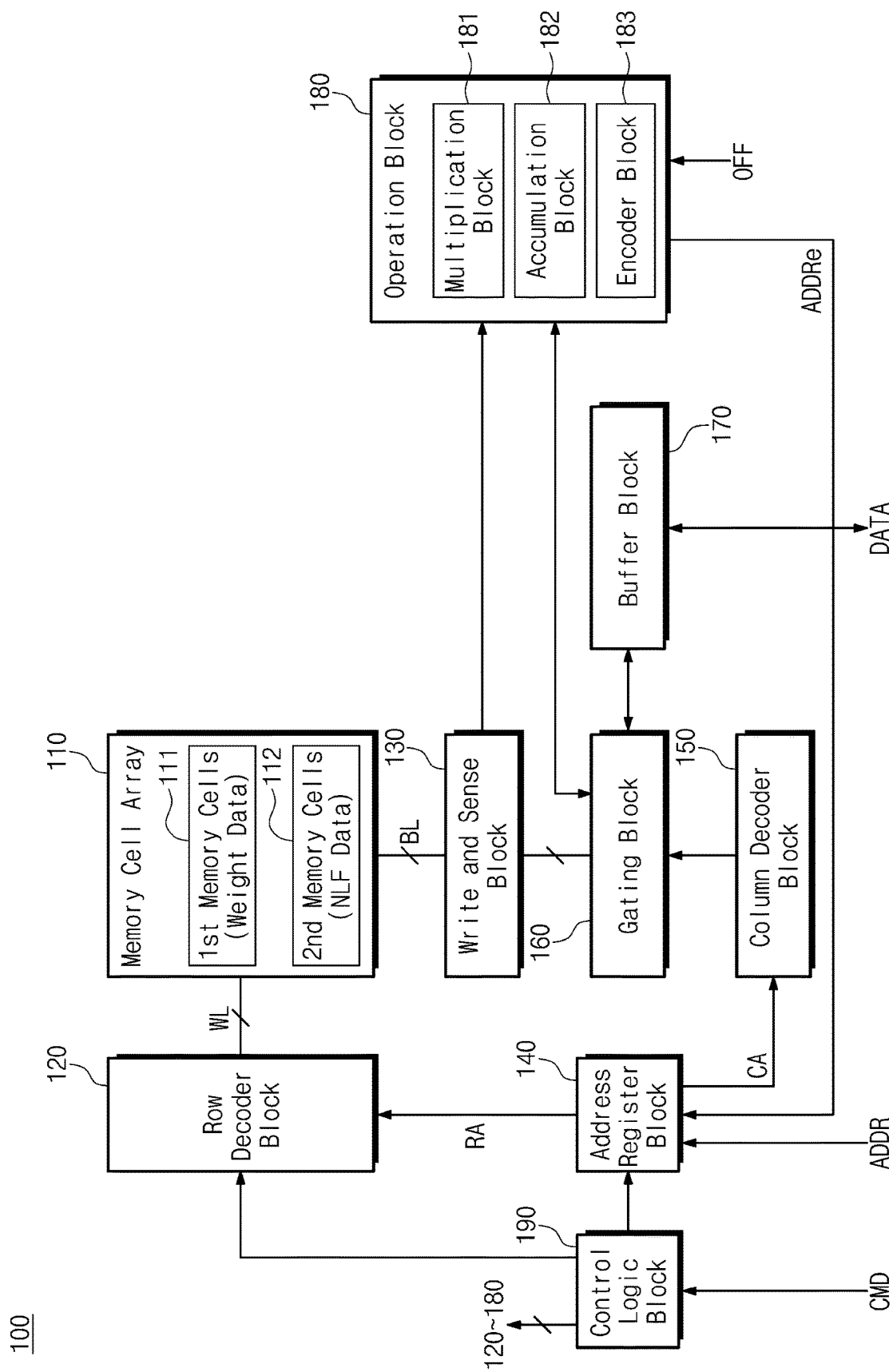
FIG. 1 illustrates a semiconductor memory device according to an embodiment.

FIG. 1 illustrates a semiconductor memory device 100 according to an embodiment. The semiconductor memory device 100 may be implemented with various memory devices. For example, the semiconductor memory device 100 may be implemented with a volatile memory device such as a static random access memory (SRAM) or a dynamic random access memory (DRAM).

The semiconductor memory device 100 may be implemented with a random access memory such as an SRAM, a DRAM, a phase-change RAM (PRAM), a magnetic RAM (MRAM), a ferroelectric RAM (FeRAM), or a resistive RAM (RRAM). The semiconductor memory device 100 may be implemented with a nonvolatile memory device such as a PRAM, an MRAM, an FRAM, an RRAM, or a flash memory.

Referring to FIG. 1, the semiconductor memory device 100 includes a memory cell array 110, a row decoder block 120, a write and sense block 130, an address register block 140, a column decoder block 150, a gating block 160, a buffer block 170, a operation block 180, and a control logic block 190.

The memory cell array 110 may include first memory cells 111 and second memory cells 112. Weight data associated with a neural network may be stored in the first memory cells 111. Non-linear function (NLF) data associated with the neural network may be stored in the second memory cells 112. The non-linear function data may be data of an activation function.

The row decoder block 120 is connected to the memory cell array 110 through word lines WL. The word lines WL may be connected to rows of memory cells including the first memory cells 111 and the second memory cells 112. The row decoder block 120 may select one of the word lines WL based on the row address RA.

The write and sense block 130 is connected to the memory cell array 110 through bit lines BL. The bit lines BL may be connected to columns of memory cells including the first memory cells 111 and the second memory cells 112. The write and sense block 130 may perform a read operation or a write operation on memory cells of the selected word line.

For example, in a first operating mode (e.g., a normal mode), the write and sense block 130 may exchange data with the gating block 160. The write and sense block 130 may write data transmitted from the gating block 160 to the memory cell array 110. The write and sense block 130 may output data read from the memory cell array 110 to the gating block 160. In a second operating mode (e.g., a calculating mode), the write and sense block 130 may output data read from the memory cell array 110 to the operation block 180.

The address register block 140 may receive an address ADDR from an external device or may receive an encoded address ADDRe from the operation block 180. The address register block 140 may transmit a row address RA of the received address ADDR or ADDRe to the row decoder block 120 and may transmit a column address CA of the received address ADDR or ADDRe to the column decoder block 150.

The column decoder block 150 may control the gating block 160 in response to the column address CA. The gating block 160 may connect bit lines corresponding to the column address CA among the bit lines BL to the write and sense block 130 and the buffer block 170. For another example, the gating block 160 may electrically connect a part of the write and sense block 130, which corresponds to the column address CA, to the buffer block 170.

For example, in the first operating mode (e.g., a normal mode), the gating block 160 may exchange data with the write and sense block 130. The gating block 160 may provide data from the write and sense block 130 to the buffer block 170 or may provide data from the buffer block 170 to the write and sense block 130.

In the second operating mode (e.g., a calculating mode), the gating block 160 may provide data from the operation block 180 to the buffer block 170 or may provide data from the buffer block 170 to the operation block 180.

The buffer block 170 may store data "DATA". For example, the buffer block 170 may store data received from the external device or data to be output to the external device. The buffer block 170 may store data read from the memory cell array 110 or data to be written to the memory cell array 110.

The operation block 180 may perform operation on data to be operated among the data provided from the write and sense block 130. The operation block 180 may include a multiplication block 181, an accumulation block 182, and an encoder block 183. The multiplication block 181 may multiply a value of data provided from the write and sense block 130 by a value of data provided from the gating block 160. The accumulation block 182 may add an operation result of the multiplication block 181 to a value of any other data stored therein. For example, the multiplication block 181 and the accumulation block 182 may constitute a multiplier-accumulator (MAC).

The encoder block 183 may encode accumulated data stored in the accumulation block 182 to generate the encoded address ADDRe. The encoder block 183 may receive an offset OFF, and may use the offset OFF to generate the encoded address ADDRe. The offset OFF may be received from the external device by using the address ADDR or the data "DATA" provided to the address register block 140 or the buffer block 170, respectively.

The control logic block 190 may receive a command CMD from the external device. The control logic block 190 may control the row decoder block 120, the write and sense block 130, the address register block 140, the column decoder block 150, the gating block 160, the buffer block 170, the operation block 180, and the encoder block 183, based on the command CMD. The row decoder block 120, the write and sense block 130, the address register block 140, the column decoder block 150, the gating block 160, the buffer block 170, the operation block 180, the encoder block 183, and the control logic block 190 may constitute a peripheral circuit of the memory cell array 110.

The semiconductor memory device 100 according to an embodiment may support operations associated with the neural network. The operation block 180 may support operation of multiplication and accumulation sum associated with input data and weights of the neural network. The encoder block 183 may support operation of an activation function which is a non-linear function (NLF). Because the multiplication, the accumulation sum, and the activation function are all performed in the semiconductor memory device 100, the semiconductor memory device 100 may completely perform the operations associated with the neural network.

Accordingly, a frequency at which the semiconductor memory device 100 communicates with the external device for the purpose of performing the operations associated with the neural network may decrease, and thus, data traffic and the use of an external resource are reduced.

Figure 2:
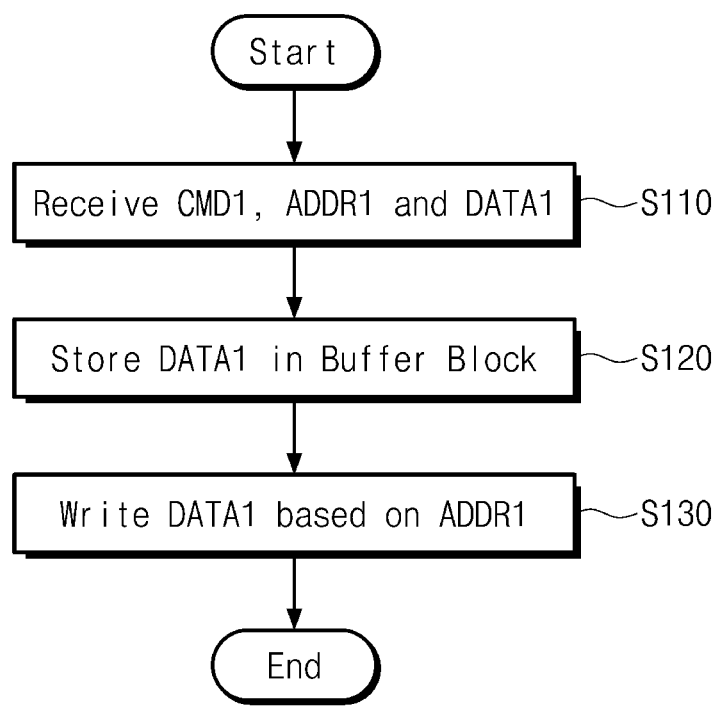
FIG. 2 illustrates an example of loading weight data and non-linear function data onto a memory cell array.
Figure 3:
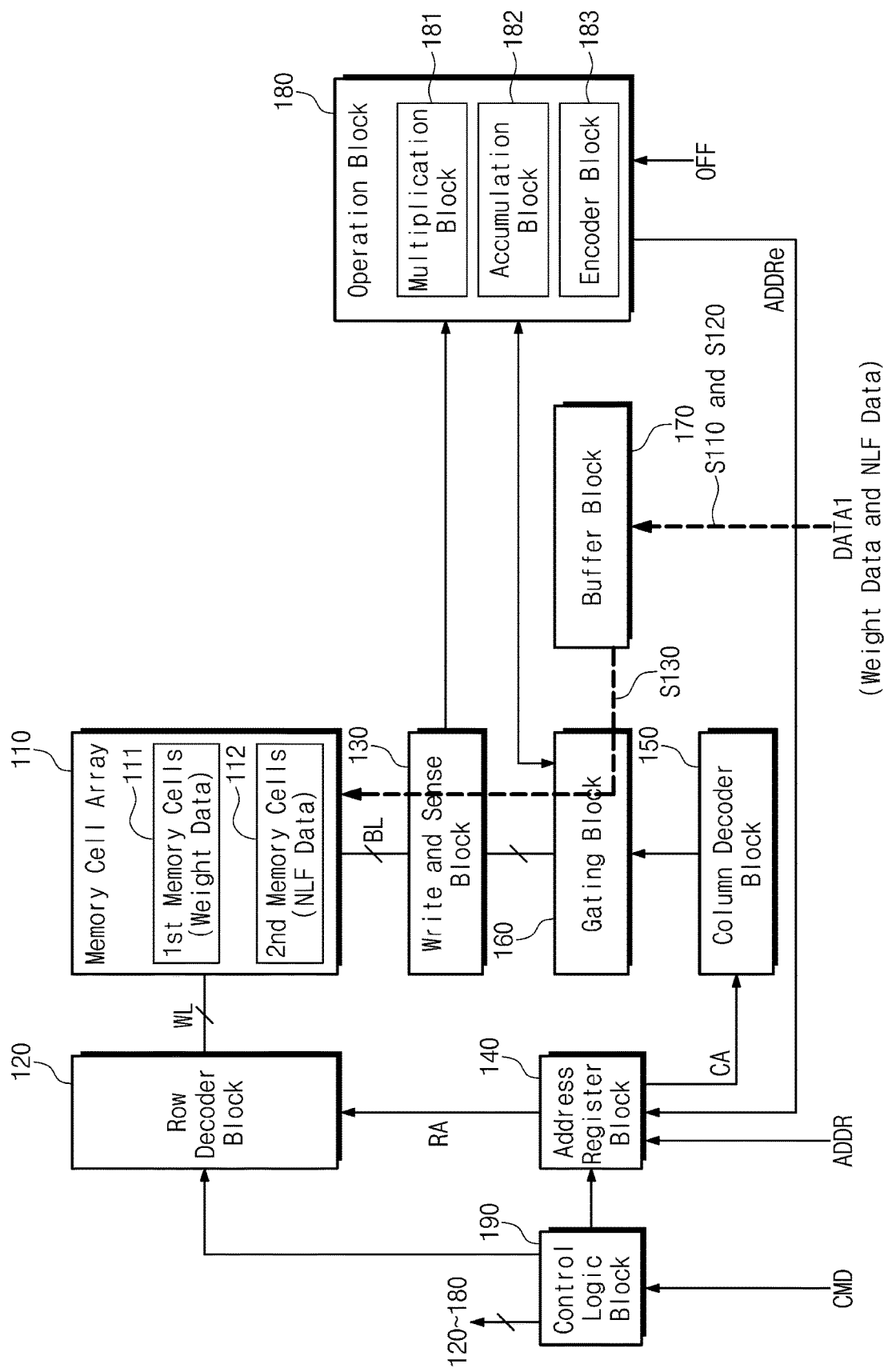
FIG. 3 illustrates an example of loading weight data and non-linear function data onto a memory cell array depending on an example of FIG. 2 in a semiconductor memory device of FIG. 1.

FIG. 2 illustrates an example of loading weight data and non-linear function (NLF) data onto the memory cell array 110. FIG. 3 illustrates an example of loading weight data and non-linear function (NLF) data onto the memory cell array 110 depending on an example of FIG. 2 in the semiconductor memory device 100 of FIG. 1. Operations of FIGS. 2 and 3 may be performed in the first operating mode (e.g., a normal mode).

Referring to FIGS. 2 and 3, in operation S110, the semiconductor memory device 100 may receive a first command CMD1, a first address ADDR1, and first data DATA1 from an external device. The first command CMD1 may be a write command. The first address ADDR1 may indicate memory cells in the first memory cells 111 and/or the second memory cells 112.

The first data DATA1 may include weight data and the non-linear function (NLF) data. In operation S120, in response to the first command CMD1, the buffer block 170 may store the first data DATA1 received from the external device.

In operation S130, in response to the first command CMD1, the write and sense block 130 may write the first data DATA1 provided from the buffer block 170 through the gating block 160 in the memory cells, which the first address ADDR1 indicates, from among the first memory cells 111 and the second memory cells 112.

For example, a procedure (or a sequence) described with reference to FIGS. 2 and 3 may be repeatedly performed to write all the weight data in the first memory cells 111 and write all the non-linear function (NLF) data in the second memory cells 112. For example, after power is supplied to the semiconductor memory device 100 and initialization is completed, as described with reference to FIGS. 2 and 3, the weight data and the non-linear function (NLF) data may be loaded onto the semiconductor memory device 100.

Figure 4:
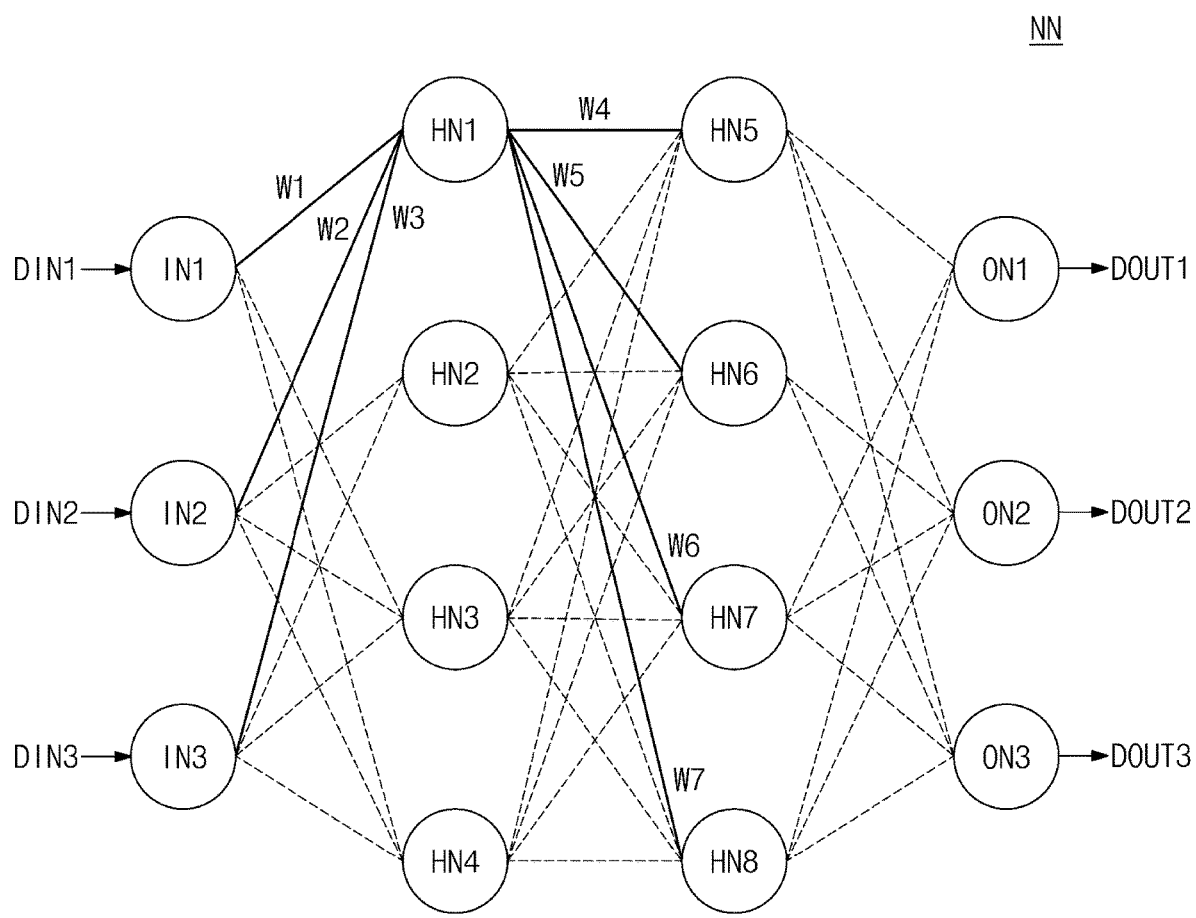
FIG. 4 illustrates an exemplary structure of a neural network which a semiconductor memory device supports.

FIG. 4 illustrates an exemplary structure of a neural network NN which the semiconductor memory device 100 supports. Referring to FIG. 4, the neural network NN may include input nodes IN1 to IN3, hidden nodes HN1 to HN8, and output nodes ON1 to ON3.

The input nodes IN1 to IN3 may constitute an input layer. The first to fourth hidden nodes HN1 to HN4 may constitute a first hidden layer. The fifth to eighth hidden nodes HN5 to HN8 may constitute a second hidden layer. The output nodes ON1 to ON3 may constitute an output layer.

Input data DIN1 to DIN3 may be respectively provided to the input nodes IN1 to IN3. The input nodes IN1 to IN3 may be respectively connected to the first to fourth hidden nodes HN1 to HN4 of the first hidden layer. Each connection may have a weight. Each of the input data DIN1 to DIN3 may be multiplied by the weight of each connection and provided to the corresponding hidden node. At each hidden node of the first hidden layer, results of multiplying at lease one of the input data DIN1 to DIN3 by the corresponding weight are summed. A summed result may be obtained by the activation function and refined.

Each of the first to fourth hidden nodes HN1 to HN4 of the first hidden layer may be connected to the fifth to eighth hidden nodes HN5 to HN8 of the second hidden layer. Each connection may have a weight. The refined value of each of the hidden nodes of the first hidden layer may be multiplied by the weight of each connection and provided to the corresponding hidden node of the second hidden layer. At each hidden node of the second hidden layer, results of multiplying the refined values of the hidden nodes of the first hidden layer by the weights are summed. A summed result may be obtained by the activation function and refined.

Each hidden node of the second hidden layer may be connected to the output nodes ON1 to ON3 of the output layer. Each connection may have a weight. The refined values of each hidden node of the second hidden layer may be multiplied by the weight of each connection and provided to the corresponding output node. At each output node of the output layer, results of multiplying the refined values of the hidden nodes of the second hidden layer by the weights are summed. A summed result may be obtained by the activation function and refined. The refined values of the output nodes ON1 to ON3 may be output data DOUT1 to DOUT3.

In an embodiment, to briefly describe how the semiconductor memory device 100 supports operations of the neural network NN, connections associated with the first hidden node HN1 and first to seventh weights W1 to W7 of the connections are marked by a bold solid line.

Figure 5:
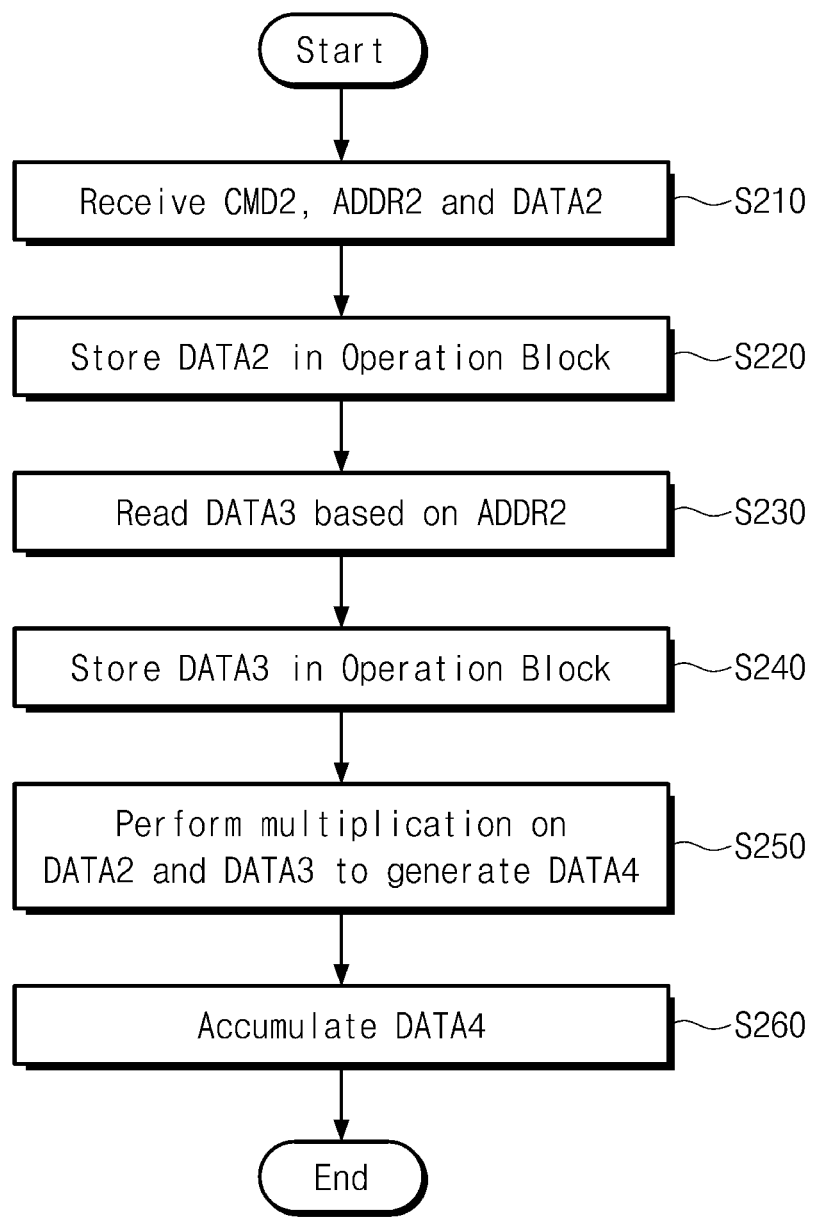
FIG. 5 illustrates an example in which a semiconductor memory device obtains multiplication and accumulation sums.
Figure 6:
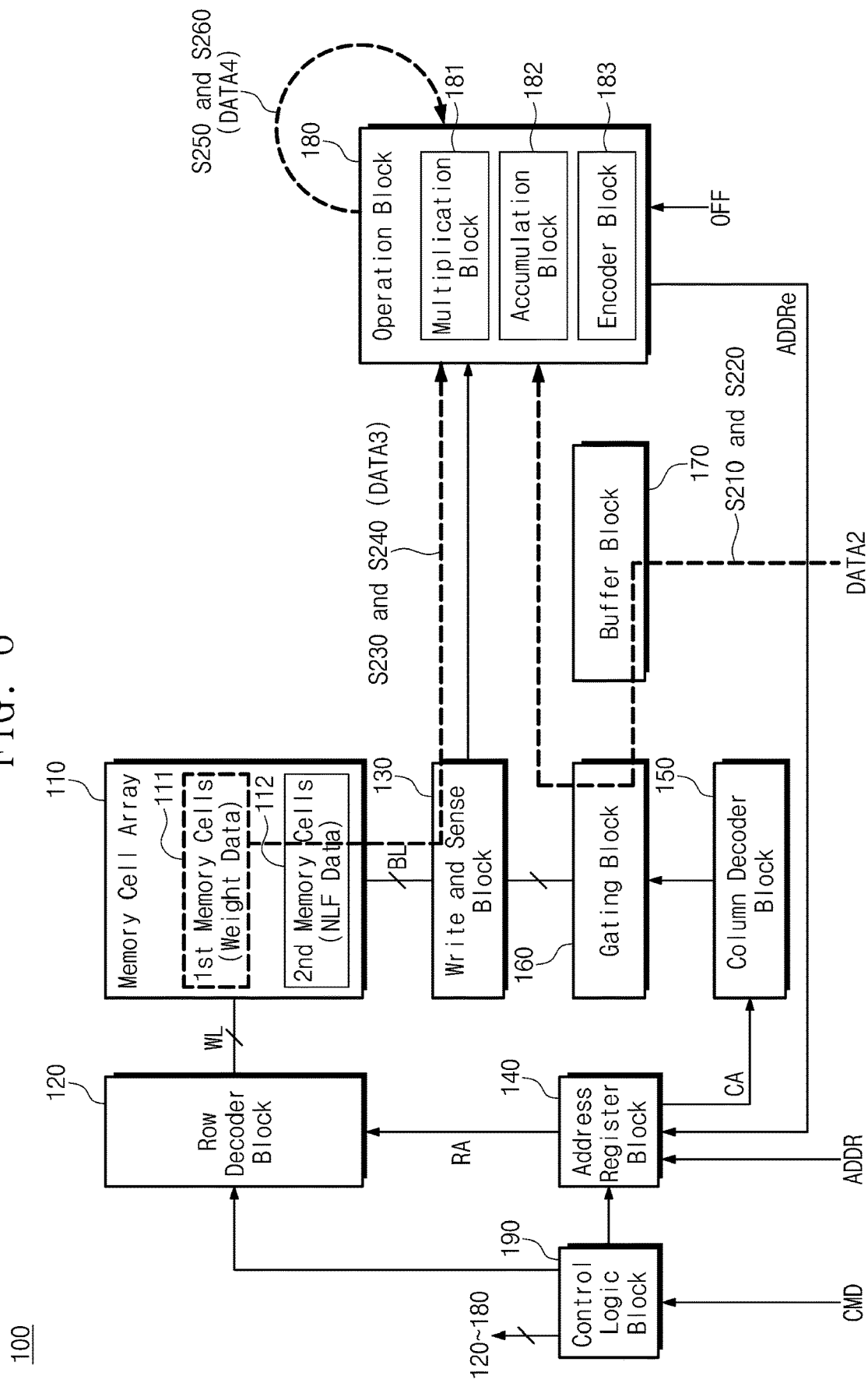
FIG. 6 illustrates a process in which multiplication and accumulation sums are obtained according to an example of FIG. 5 in a semiconductor memory device of FIG. 1.

FIG. 5 illustrates an example in which the semiconductor memory device 100 obtains multiplication and accumulation sums. FIG. 6 illustrates a process in which multiplication and accumulation sums are obtained according to an example of FIG. 5 in the semiconductor memory device 100 of FIG. 1. Operations of FIGS. 5 and 6 may be performed in the second operating mode (e.g., a calculating mode).

Referring to FIGS. 4 to 6, in operation S210, the semiconductor memory device 100 may receive a second command CMD2, a second address ADDR2, and second data DATA2 from the external device. The second command CMD2 may be a first operation command. Alternatively, the second command CMD2 may be a write command received along with a description indicating a first operation. The second address ADDR2 may indicate the first memory cells 111 in which weight data are stored. In operation S220, the semiconductor memory device 100 may store the second data DATA2 in the operation block 180.

In operation S230, in response to the second command CMD2, the semiconductor memory device 100 may read third data DATA3 from the first memory cells 111 based on the second address ADDR2. In operation S240, the semiconductor memory device 100 may store the third data DATA3 in the operation block 180.

The second data DATA2 may be data to be multiplied by a weight in the neural network NN of FIG. 4. For example, the second data DATA2 may be the first input data DIN1. The third data DATA3 may be a weight of the neural network NN of FIG. 4. For example, the third data DATA3 may be the first weight W1 to be multiplied by the first input data DIN1.

In operation S250, the multiplication block 181 of the operation block 180 of the semiconductor memory device 100 may perform multiplication on the second data DATA2 and the third data DATA3 to generate fourth data DATA4. In operation S260, the accumulation block 182 of the operation block 180 may accumulate the fourth data DATA4.

For example, the accumulation data may be stored in the operation block 180. When an operation associated with a specific node of the neural network NN is started, the accumulation data may have an initial value (e.g., 0). As the procedure (or the sequence) described with reference to FIGS. 5 and 6 is performed once, the accumulation data may be updated by a value of the fourth data DATA4.

The procedure (or the sequence) described with reference to FIGS. 5 and 6 derives a result obtained by multiplying input data by a weight, and accumulating a resultant value of the multiplication, with regard to one path. As the procedure (or the sequence) described with reference to FIGS. 5 and 6 is repeatedly performed, operation on inputs and weights associated with one node of the neural network NN of FIG. 4 may be completed.

For example, the first input data DIN1 may be input as the second data DATA2, and a value indicating a storage space of the first memory cells 111 in which the first weight W1 is stored may be received as the second address ADDR2. As the procedure (or the sequence) described with reference to FIGS. 5 and 6 is performed according to the second command CMD2, a value to be provided from the first input node IN1 to the first hidden node HN1 is obtained.

The second input data DIN2 may be input as the second data DATA2, and a value indicating a storage space of the first memory cells 111 in which the second weight W2 is stored may be received as the second address ADDR2. As the procedure (or the sequence) described with reference to FIGS. 5 and 6 is further performed according to the second command CMD2, a value to be provided from the first and second input nodes IN1 and IN2 to the first hidden node HN1 is obtained.

The third input data DIN3 may be input as the second data DATA2, and a value indicating a storage space of the first memory cells 111 in which the third weight W3 is stored may be received as the second address ADDR2. As the procedure (or the sequence) described with reference to FIGS. 5 and 6 is further performed according to the second command CMD2, a value to be provided from the first to third input nodes IN1 to IN3 to the first hidden node HN1 is obtained.

That is, with regard to the first hidden node HN1 of the neural network NN of FIG. 4, a final input value associated with the first hidden node HN1 by performing the procedure (or the sequence) of FIGS. 5 and 6 three times, for example, an accumulation sum in which weights W1 to W3 are applied to (e.g., multiplied by) the input data DIN1 to DIN3 may be obtained.

In an embodiment, after obtaining an accumulation sum as described with reference to FIGS. 5 and 6, the operation block 180 may add a specific value to the accumulation sum. The added value may be an offset value or a bias value. The offset value or the bias value may be adjusted according to a type of the neural network NN or may be omitted.

In an embodiment, in a memory such as a DRAM, a specific time may be taken to activate one row (e.g., a word line). In such a memory which requires a certain time to activate each row, a first time may be taken to read data while sweeping columns (e.g., bit lines) in a state where one row is continuously activated. After activating the row and reading the data, a second time may be taken to activate another row and to read data. The second time may be greater than the first time.

Depending on this characteristic where a specific time is taken to activate one row in the semiconductor memory device 100, weight data of weights associated with inputs of one node of the neural network NN may be stored at the same row. Upon obtaining a final input of one node, because operations of reading data while sweeping columns with regard to the same row are performed, a time taken to obtain the final input of the one node may decrease.

Figure 7:
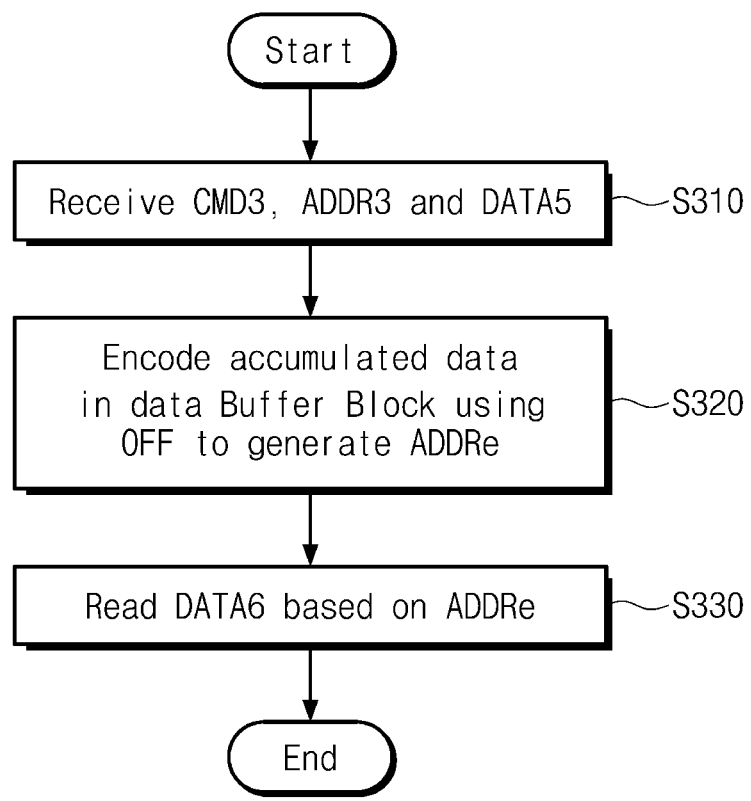
FIG. 7 illustrates an example in which a semiconductor memory device obtains a value of a non-linear function.
Figure 8:
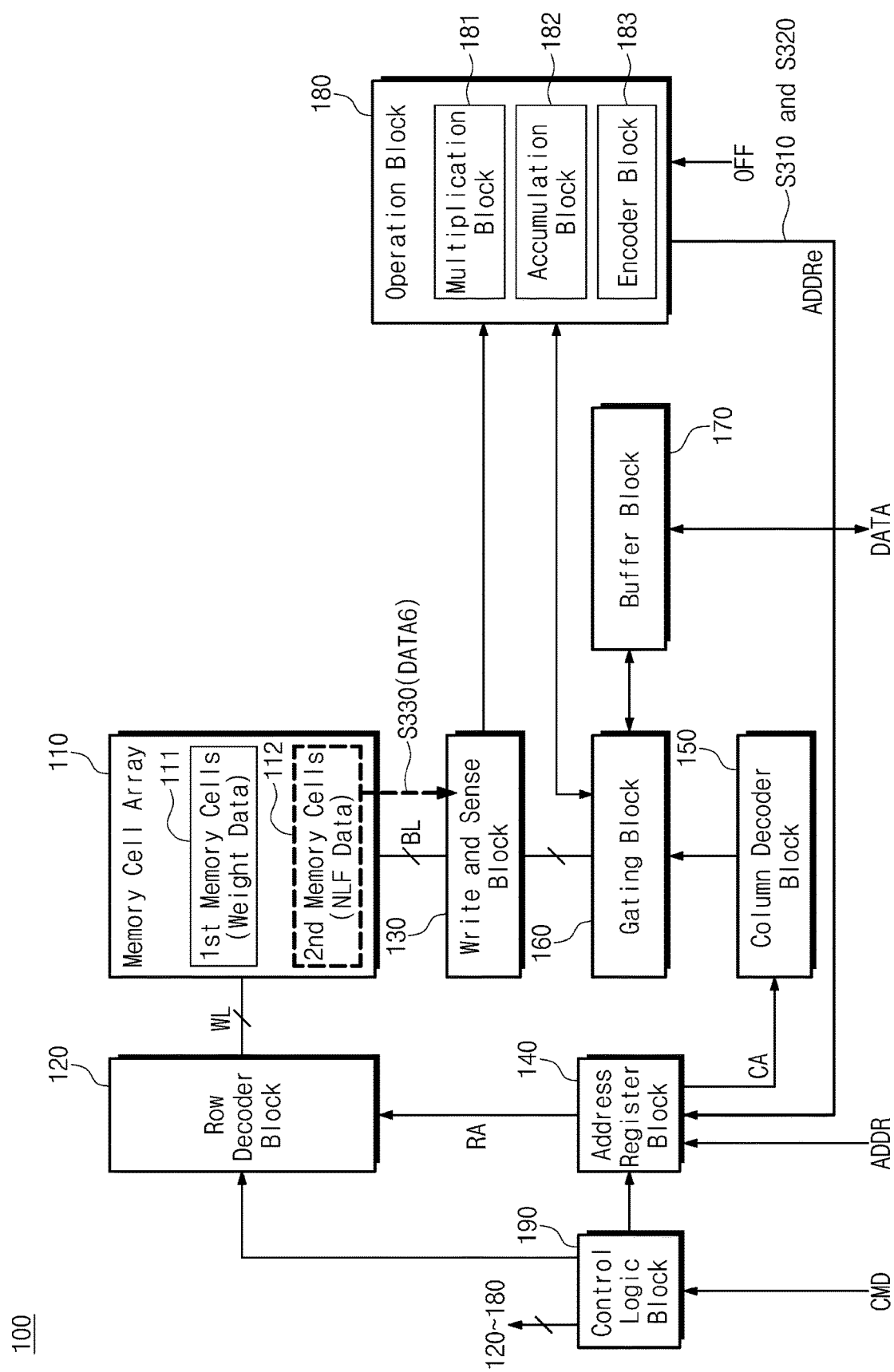
FIG. 8 illustrates a process in which a value of a non-linear function is obtained according to an example of FIG. 7 in a semiconductor memory device of FIG. 1.

FIG. 7 illustrates an example in which the semiconductor memory device 100 obtains a value of a non-linear function (NLF). FIG. 8 illustrates a process in which a value of the non-linear function (NLF) is obtained according to an example of FIG. 7 in the semiconductor memory device 100 of FIG. 1. Operations of FIGS. 7 and 8 may be performed in the second operating mode (e.g., a calculating mode).

Referring to FIGS. 4, 7, and 8, in operation S310, the semiconductor memory device 100 may receive a third command CMD3, a third address ADDR3, and fifth data DATA5 from the external device. The third command CMD3 may be a second operation command. Alternatively, the third command CMD3 may be a write command received along with a description indicating a second operation. Alternatively, the third command CMD3 may be a read command received along with a description indicating the second operation.

The third address ADDR3 may include an offset OFF or may not include the offset OFF. The third address ADDR3 may be a dummy address which does not indicate specific memory cells or is ignored by the semiconductor memory device 100.

The fifth data DATA5 may include the offset OFF or may not include the offset OFF. The fifth data DATA5 may not include information to be written or may be a dummy address which is ignored by the semiconductor memory device 100. When the third command CMD3 is a read command, the fifth data DATA5 may not be received.

The offset OFF included in the third address ADDR3 or the fifth data DATA5 may be provided to the encoder block 183 of the operation block 180. A description is given as the offset OFF is included in the third address ADDR3 or the fifth data DATA5, but a signal in which the offset OFF is included is not limited to an address or data. The offset OFF may be received through any other control signal or a specified dedicated signal.

In operation S320, the encoder block 183 of the operation block 180 in the semiconductor memory device 100 may generate an encoded address ADDRe by encoding accumulation data of the operation block 180 by using the offset OFF.

As described with reference to FIGS. 4 to 6, the accumulation data of the operation block 180 may be a final input value of the first hidden node HN1. When the activation function, which is the non-linear function (NLF), is applied to the accumulation data of the operation block 180, an output value of the first hidden node HN1 may be obtained.

The non-linear function (NLF) data stored in the second memory cells 112 may include operation results of the activation function associated with input values of each node of the neural network NN. Locations where the operation results of the activation function are stored may be set based on the input values. That is, by encoding an input value according to the setting, an operation result of the activation function corresponding to the input value may be read from the second memory cells 112.

In an embodiment, two or more types of activation function may be used based on a type of the neural network NN. The offset OFF may indicate whether any activation function among two or more types of activation function is used. That is, the second memory cells 112 may store operation results of two or more activation functions. Locations where the operation results of the two or more activation functions are stored may be set based on the input values and the offset OFF.

In operation S330, the semiconductor memory device 100 may read sixth data DATA6 from the second memory cells 112 based on the encoded address ADDRe. For example, the sixth data DATA6 may be output to the external device through the gating block 160 and the buffer block 170. For another example, the sixth data DATA6 may be provided to the operation block 180 and may be used for a following operation.

As the procedure (or the sequence) of FIGS. 7 and 8 is performed, a result value of the activation function, which is the non-linear function (NLF), is read. Accordingly, the semiconductor memory device 100 may completely perform operations associated with the first hidden node HN1 of the neural network NN of FIG. 4. Likewise, the semiconductor memory device 100 may completely perform operations associated with each node of the neural network NN of FIG. 4.

In an embodiment, when the third command CMD3 is a read command, the semiconductor memory device 100 may output the sixth data DATA6 in response to the third command CMD3. That is, after operations associated with a specific node of the neural network NN are completed, the semiconductor memory device 100 may output a final result to the external device.

Figure 9:
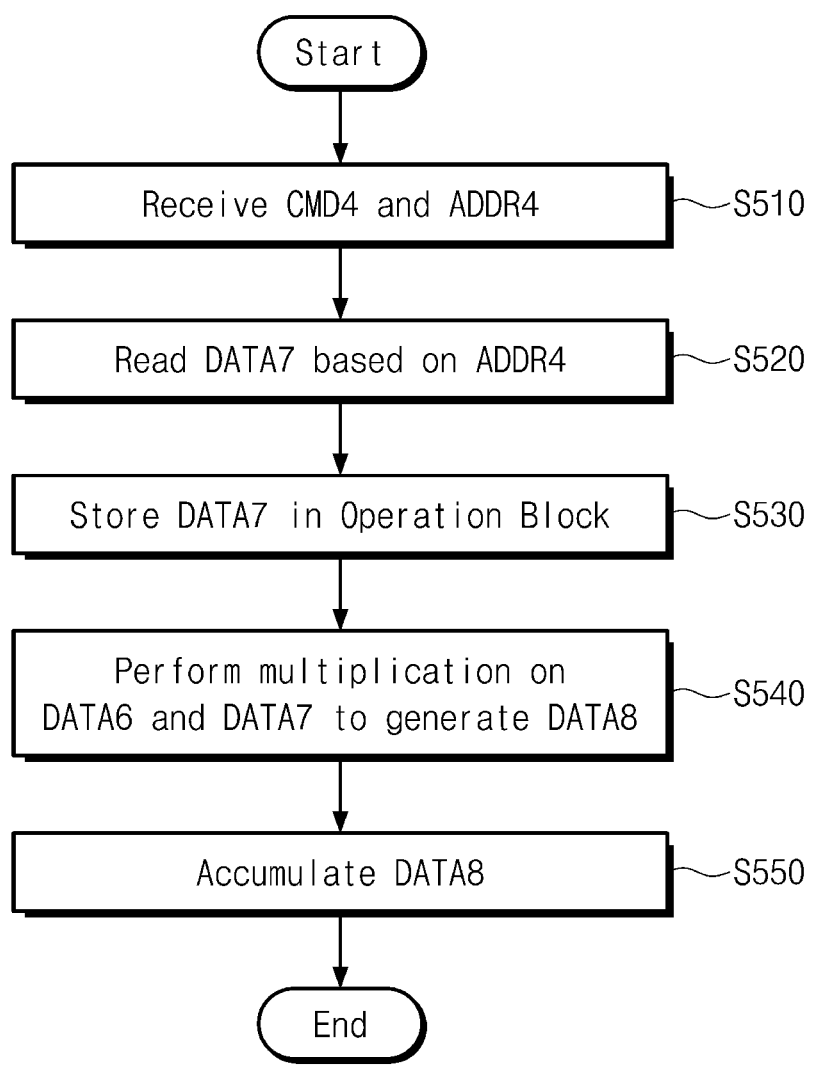
FIG. 9 illustrates an example in which a semiconductor memory device uses a final result associated with a specific node of a neural network for an operation of a next node.

FIG. 9 illustrates an example in which the semiconductor memory device 100 uses a final result associated with a specific node of the neural network NN for an operation of a next node. Referring to FIGS. 1, 4, and 9, in operation S510, the semiconductor memory device 100 may receive a fourth command CMD4 and a fourth address ADDR4.

The fourth command CMD4 may be a write command similar to the second command CMD2. The fourth address ADDR4 may indicate a location where one of the weights W4 to W7 of following nodes connected with the first hidden node HN1 is stored. Because a final result of the first hidden node HN1 is stored in the buffer block 170, an input value from the first hidden node HN1 is not required at the fifth to eighth hidden nodes HN5 to HN8. Accordingly, dummy data may be received along with the fourth command CMD4 and the fourth address ADDR4.

In operation S520, the semiconductor memory device 100 may read seventh data DATA7 corresponding to one of the fourth to seventh weights W4 to W7 from the first memory cells 111 based on the fourth address ADDR4. Operation S520 may be identical to operation S230 of FIG. 5.

In operation S530, the semiconductor memory device 100 may store the seventh data DATA7 in the operation block 180. In operation S540, the multiplication block 181 of the operation block 180 of the semiconductor memory device 100 may multiply the sixth data DATA6 by the seventh data DATA7 to generate eighth data DATA8. In operation S550, the accumulation block 182 of the operation block 180 in the semiconductor memory device 100 may accumulate the eighth data DATA8. Operation S530 to operation S550 may be performed to be identical to operation S240 to operation S260 of FIG. 5.

As described with reference to FIGS. 4 and 9, the semiconductor memory device 100 may support a function of performing an operation of a next node by using a result of obtaining a final result of a specific node. Afterwards, operations of a next node may be further performed by using other input values of the next node.

Figure 10:
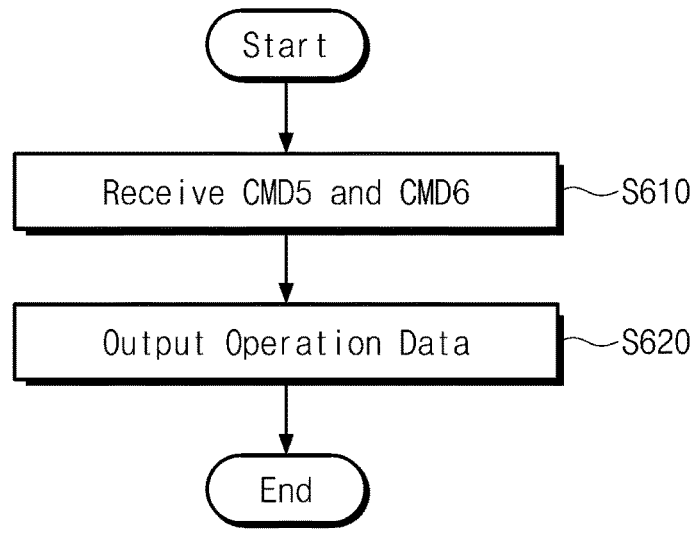
FIG. 10 illustrates an example in which a semiconductor memory device outputs data.

FIG. 10 illustrates an example in which the semiconductor memory device 100 outputs data. Referring to FIGS. 1 and 10, in operation S610, the semiconductor memory device 100 may receive a fifth command CMD5 and a fifth address ADDR5. The fifth command CMD5 may be a command for outputting an operation result. For another example, the fifth command CMD5 may be a read command received with a description requesting an output of an operation result. The fifth address ADDR5 may be a dummy address. The fifth address ADDR5 may include a description requesting an output of an operation result.

In operation S620, in response to the fifth command CMD5, the semiconductor memory device 100 may output an operation result. For example, the semiconductor memory device 100 may output accumulation data of the accumulation block 182. The semiconductor memory device 100 may output the accumulation data of the operation block 180 to the external device without performing an operation of reading data from the memory cell array 110.

For another example, the semiconductor memory device 100 may output non-linear function data read from the second memory cells 112. The semiconductor memory device 100 may output non-linear function data stored in advance in the operation block 180 or the buffer block 170 (without a read operation), or may newly read non-linear function data from the second memory cells 112 (in response to the fifth command CMD5) and may output the read non-linear function data.

Figure 11:
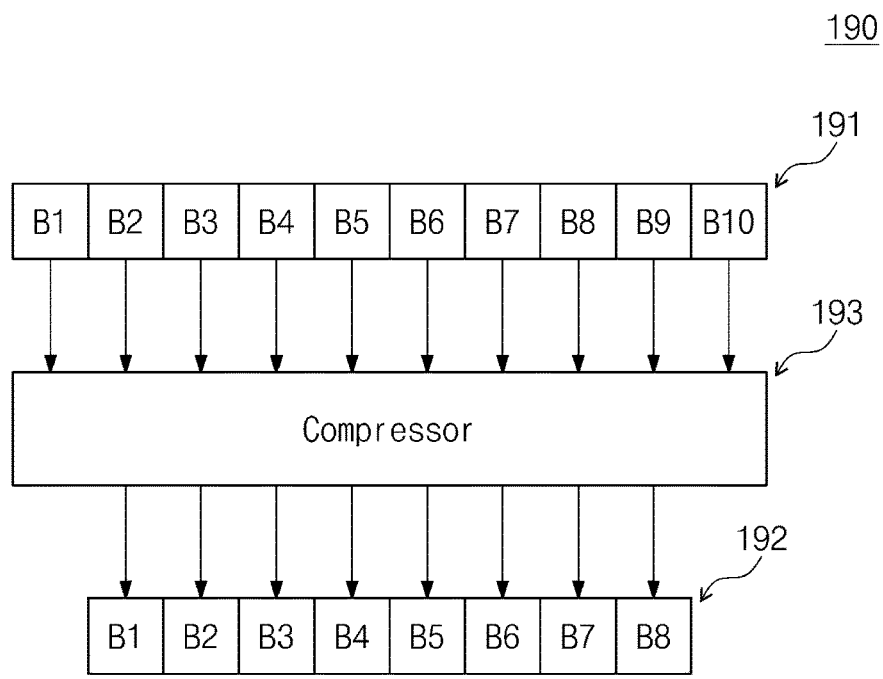
FIG. 11 illustrates an encoder block according to an embodiment.

FIG. 11 illustrates the encoder block 183 according to an embodiment. Referring to FIGS. 1, 4, and 11, the encoder block 183 includes an input bit register 191, an output bit register 192, and a compressor 193.

The input bit register 191 may receive accumulation data from the operation block 180. For example, the input bit register 191 may be configured to receive first to tenth bits B1 to B10 of the accumulation data.

The output bit register 192 may store the encoded address ADDRe. For example, the output bit register 192 may be configured to store first to eighth bits B1 to B8 of the encoded address ADDRe.

The compressor 193 may compress the first to tenth bits B1 to B10 of the accumulation data to the first to eighth bits B1 to B8 of the encoded address ADDRe. For example, the compressor 193 may perform lossy compression causing a loss of information.

In an embodiment, the number of bits used to express an input value of each node of the neural network NN may be more than the number of bits used to express the address ADDR of the semiconductor memory device 100. To solve this difference, the compressor 193 may perform the lossy compression.

According to the lossy compression, values in a specific range of the accumulation data of the operation block 180 are compressed to one value. That is, quantization of the accumulation data may be achieved by the lossy compression of the compressor 193. To adjust the degree of quantization, the compressor 193 may be reconfigurable.

Figure 12:
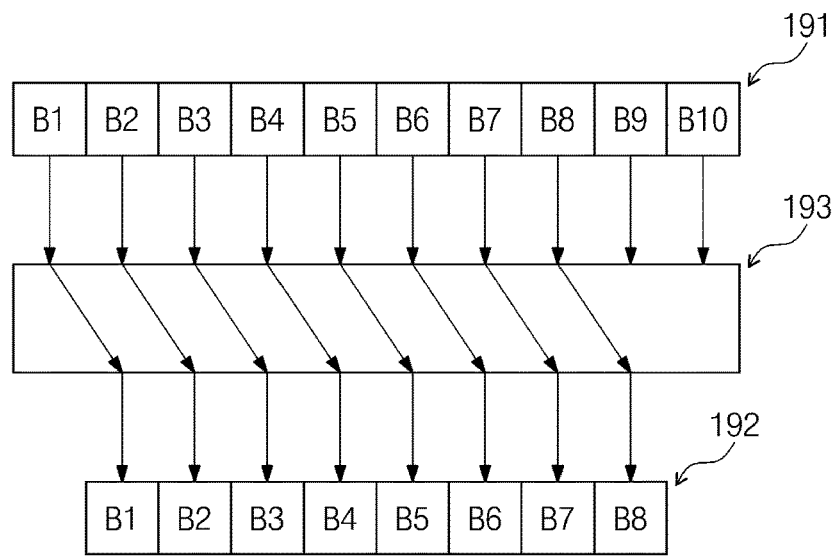
FIG. 12 illustrates a first implementation example of an encoder block.

FIG. 12 illustrates a first implementation example of the encoder block 183. Referring to FIG. 12, the compressor 193 may be configured such that the first to eighth bits B1 to B8 of the input bit register 191, that is, the most significant bits are provided as the first to eighth bits B1 to B8 of the output bit register 192.

Likewise, the compressor 193 may be configured such that eight least significant bits or eight central bits of the input bit register 191 are provided as the first to eighth bits B1 to B8 of the output bit register 192.

Alternatively, the compressor 193 may be configured such that eight sequent bits of the input bit register 191 are provided as the first to eighth bits B1 to B8 of the output bit register 192. In the compressor 193, a window of the eight sequent bits is shifted within a range of the first to tenth bits B1 to B10 of the input bit register 191.

Figure 13:
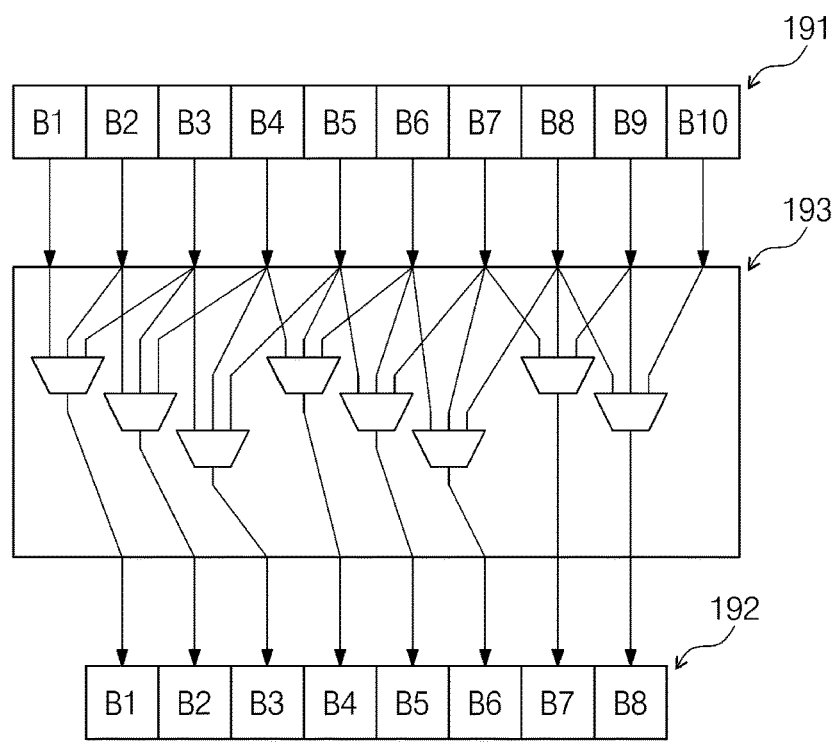
FIG. 13 illustrates a second implementation example of an encoder block.

FIG. 13 illustrates a second implementation example of the encoder block 183. Referring to FIG. 13, the compressor 193 may include multiplexers. Each of the multiplexers may select one of two or more bits of the input bit register 191 to provide the selected bit as one bit of the output bit register 192.

Bits of the input bit register 191 which are input to the multiplexers of the compressor 193 may be different from one another. Bits of the output bit register 192 which are output from the multiplexers of the compressor 193 may be different from one another.

Figure 14:
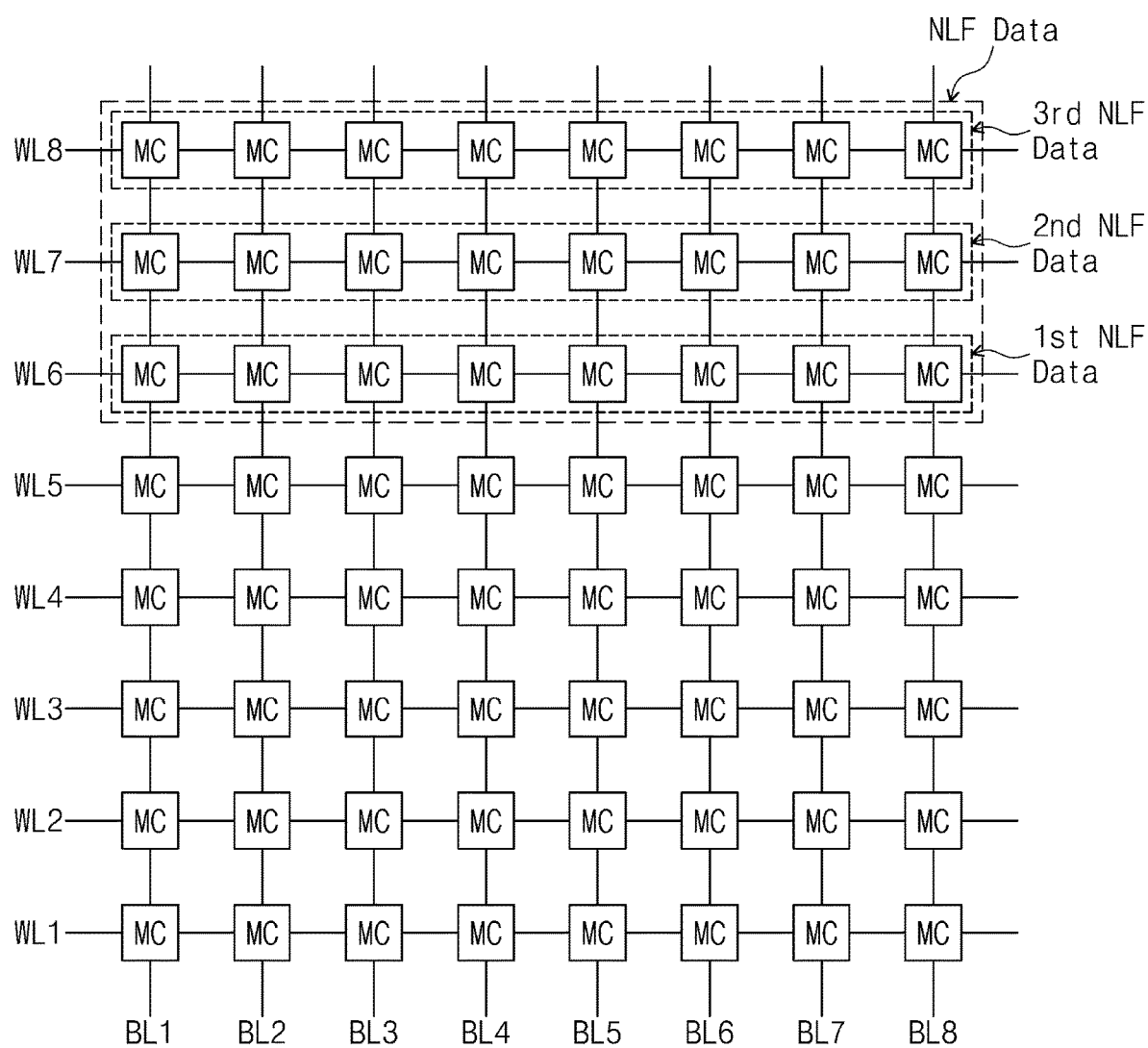
FIG. 14 illustrates a first example in which first memory cells and second memory cells are selected in a memory cell array of FIG. 1.

FIG. 14 illustrates a first example in which the first memory cells 111 and the second memory cells 112 are selected in the memory cell array 110 of FIG. 1. Referring to FIGS. 1 and 14, the word lines WL may include first to eighth word lines WL1 to WL8, and the bit lines BL may include first to eighth bit lines BL1 to BL8.

In the memory cell array 110, memory cells MC connected to the first to fifth word lines WL1 to WL5 may be selected as the first memory cells 111, and memory cells MC connected to the sixth to eighth word lines WL6 to WL8 may be selected as the second memory cells 112. That is, the first memory cells 111 and the second memory cells 112 may be divided in the unit of word lines.

The memory cells MC connected to the sixth word line WL6 may store first non-linear function (NLF) data. The memory cells MC connected to the seventh word line WL7 may store second non-linear function (NLF) data. The memory cells MC connected to the eighth word line WL8 may store third non-linear function (NLF) data. That is, result values of one type of non-linear function (NLF) may be stored in memory cells of one word line.

For example, non-linear functions may include a sigmoid function, a hyperbolic tangent function, a square root function, etc. In an embodiment, when the non-linear function (NLF) is symmetric, half the result values of the non-linear function (NLF) may be stored in the second memory cells 112.

Figure 15:
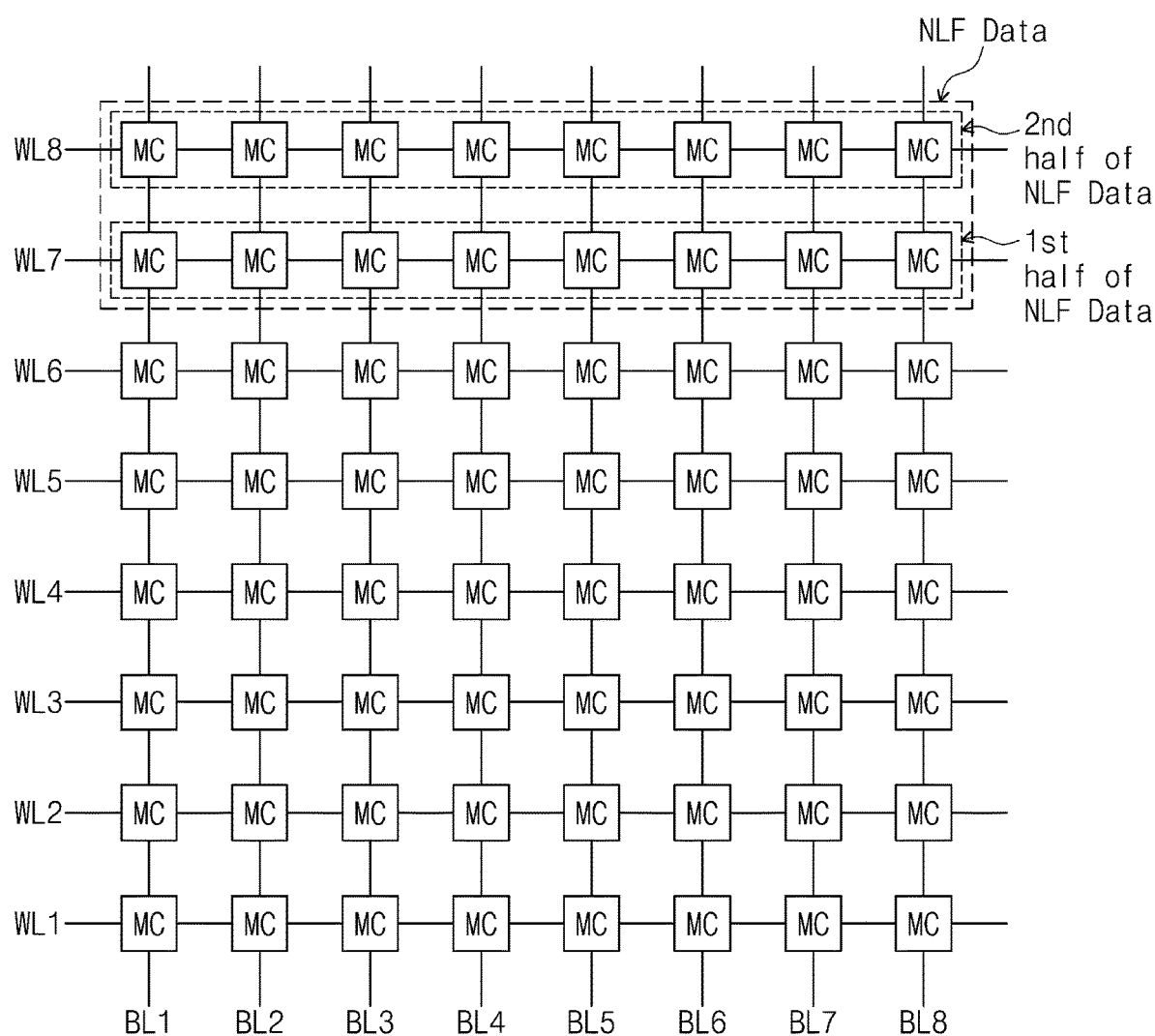
FIG. 15 illustrates a second example in which first memory cells and second memory cells are selected in a memory cell array of FIG. 1.

FIG. 15 illustrates a second example in which the first memory cells 111 and the second memory cells 112 are selected in the memory cell array 110 of FIG. 1. Referring to FIGS. 1 and 15, the memory cells MC connected to the seventh word line WL7 and the eighth word line WL8 may be selected as the second memory cells 112.

In an embodiment, a first half of non-linear function (NLF) data may be stored in the memory cells MC connected to the seventh word line WL7. In an embodiment, a second half (i.e., the rest) of non-linear function (NLF) data may be stored in the memory cells MC connected to the eighth word line WL8. That is, one type of non-linear function (NLF) data may be distributed and stored in memory cells MC connected to two or more word lines.

In an embodiment, as described with reference to FIG. 14, data of two or more types of non-linear functions may be stored in the memory cell array 110. Non-linear function (NLF) data of each type may be stored in memory cells MC connected to two or more word lines. Memory cells MC storing data of non-linear functions may be identified as the second memory cells 112.

Figure 16:
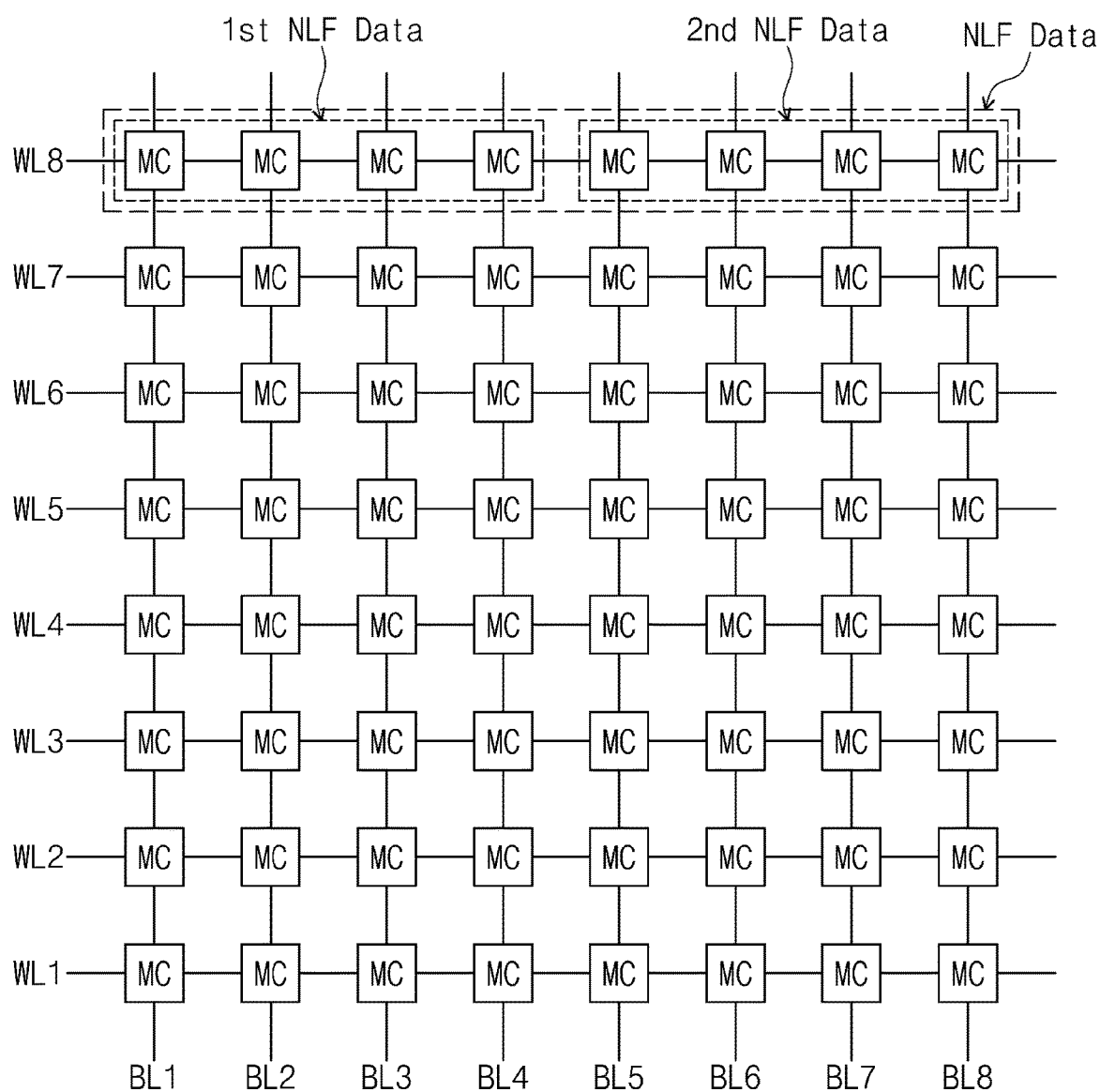
FIG. 16 illustrates a third example in which first memory cells and second memory cells are selected in a memory cell array of FIG. 1.

FIG. 16 illustrates a third example in which the first memory cells 111 and the second memory cells 112 are selected in the memory cell array 110 of FIG. 1. Referring to FIGS. 1 and 16, the memory cells MC connected to the eighth word line WL8 may be selected as the second memory cells 112.

In an embodiment, first non-linear function (NLF) data and second non-linear function (NLF) data may be stored in the memory cells MC connected to the eighth word line WL8. For example, the first non-linear function (NLF) data may be stored in half the memory cells MC connected to the eighth word line WL8. The second non-linear function (NLF) data may be stored in the other half of the memory cells MC connected to the eighth word line WL8.

In an embodiment, as described with reference to FIGS. 14 and 15, the memory cells MC connected to two or more word lines may be selected as the second memory cells 112. Data of two or more types of non-linear functions may be stored in the memory cells MC connected to each word line.

Figure 17:
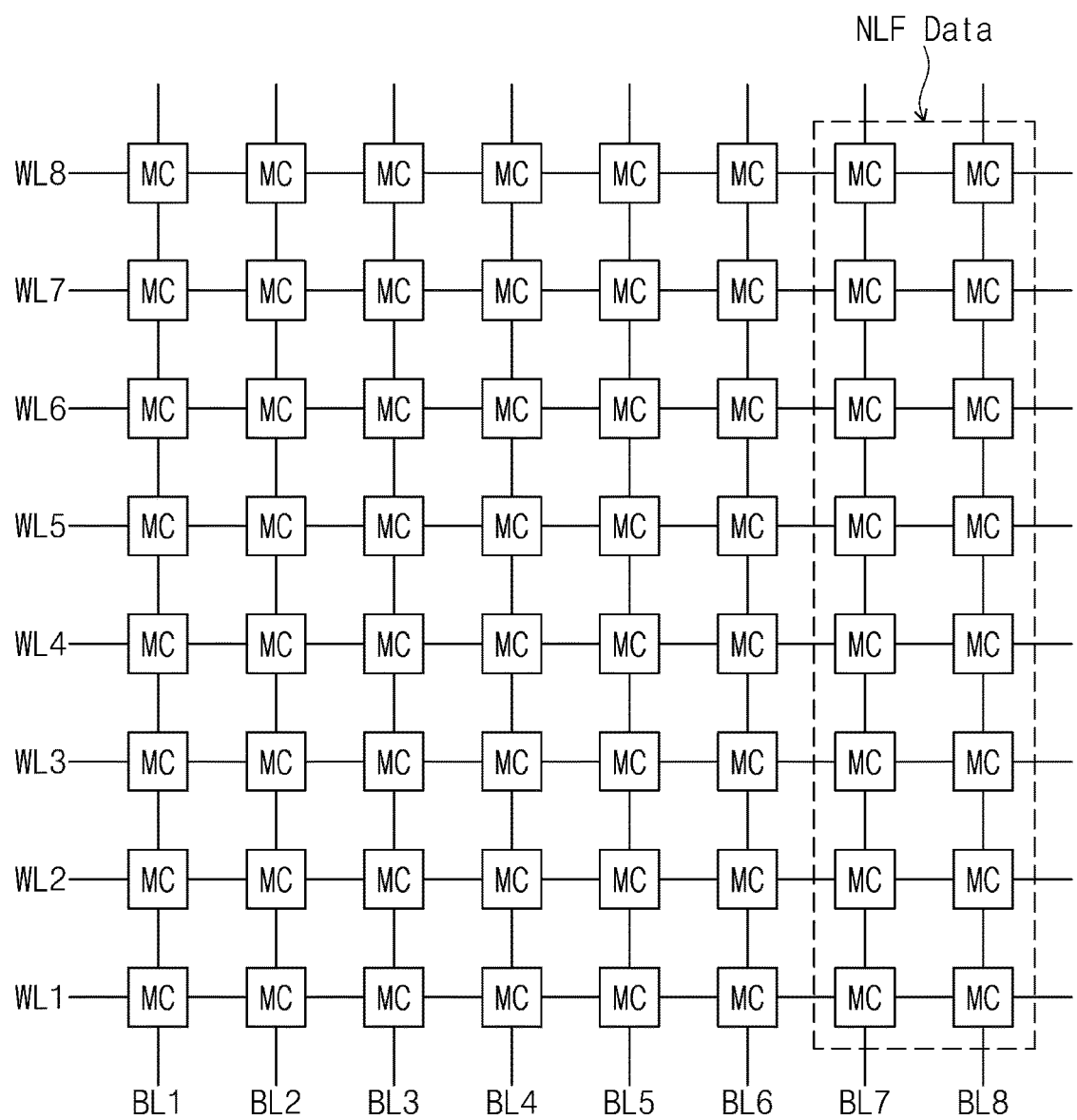
FIG. 17 illustrates a fourth example in which first memory cells and second memory cells are selected in a memory cell array of FIG. 1.

FIG. 17 illustrates a fourth example in which the first memory cells 111 and the second memory cells 112 are selected in the memory cell array 110 of FIG. 1. Referring to FIGS. 1 and 17, the memory cells MC connected to each of the first to eighth word lines WL1 to WL8 may include the first memory cells 111 and the second memory cells 112.

For example, a part of the memory cells MC connected to each word line may be selected to store weight data as the first memory cells 111. The other part of the memory cells MC connected to each word line may be selected to store non-linear function (NLF) data as the second memory cells 112.

In an embodiment, a time taken to read data while selecting different columns at the same row (e.g., a word line) is shorter than a time taken to read data while selecting different rows (e.g., word lines).

After weight data of the first memory cells 111 connected to a specific word line are used, in the case of reading non-linear function (NLF) data from the second memory cells 112 connected to the specific word line (i.e., the same word line), a time when the semiconductor memory device 100 reads the non-linear function (NLF) data may decrease, and an operating speed of the semiconductor memory device 100 may be improved.

Figure 18:
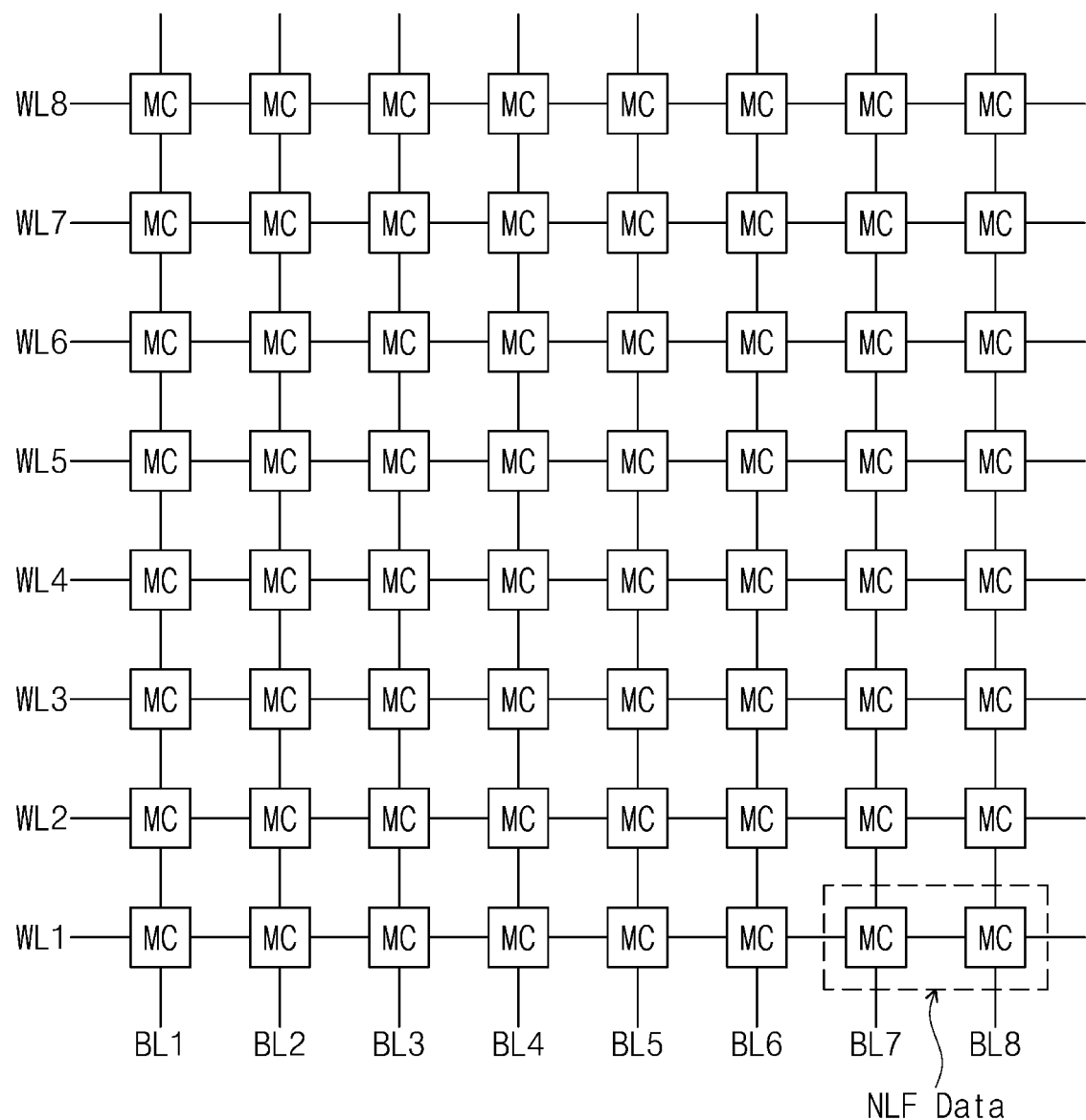
FIG. 18 illustrates a fifth example in which first memory cells and second memory cells are selected in a memory cell array of FIG. 1.

FIG. 18 illustrates a fifth example in which the first memory cells 111 and the second memory cells 112 are selected in the memory cell array 110 of FIG. 1. Referring to FIGS. 1 and 18, the memory cells MC connected to one (e.g., WL1) of the first to eighth word lines WL1 to WL8 may include the first memory cells 111 and the second memory cells 112.

The memory cells MC connected to the others of the first to eighth word lines WL1 to WL8 may include the first memory cells 111 and may not include the second memory cells 112.

In addition to the examples described with reference to FIGS. 14 to 18, non-linear function (NLF) data may be stored in the memory cells MC in various shapes. For example, the memory cell array 110 may include two or more banks. Each bank may include the memory cells MC connected to word lines and bit lines as described with reference to FIGS. 14 to 18. A read operation and a write operation may be permitted independently with regard to the banks.

Data of one type of non-linear function (NLF) may be stored in the second memory cells 112 of one bank. Data of different kinds of non-linear functions may be stored in the second memory cells 112 of different banks. That is, non-linear function (NLF) data stored in a second bank may be read according to a result of processing weight data stored in a first bank. For another example, data of one type of non-linear function (NLF) may be distributed and stored in the second memory cells 112 of two or more banks.

A way to store non-linear function (NLF) data in the memory cell array 110 may be determined based on various factors such as a capacity of data of respective weights, a capacity of respective result values of the non-linear function (NLF), and the number of memory cells MC connected to each word line of the memory cell array 110.

To improve accuracy of operations associated with the neural network NN (refer to FIG. 4), a capacity of data of each of weights and a capacity of each of result values of the non-linear function (NLF) may be increased. Also, to improve the efficiency to use a capacity of the memory cell array 110, a capacity of data of each of weights and a capacity of each of result values of the non-linear function (NLF) may be decreased. The capacity of data of each of weights and the capacity of each of result values of the non-linear function (NLF) may be traded off based on the accuracy and the efficiency.

In the case where the capacity of data of each of weights and the capacity of each of result values of the non-linear function (NLF) are determined, the first memory cells 111 and the second memory cells 112 may be selected to store weight data and non-linear function (NLF) data. The first memory cells 111 and the second memory cells 112 may be determined as described with reference to FIGS. 14 to 18, but the inventive concept is not limited thereto.

Figure 19:
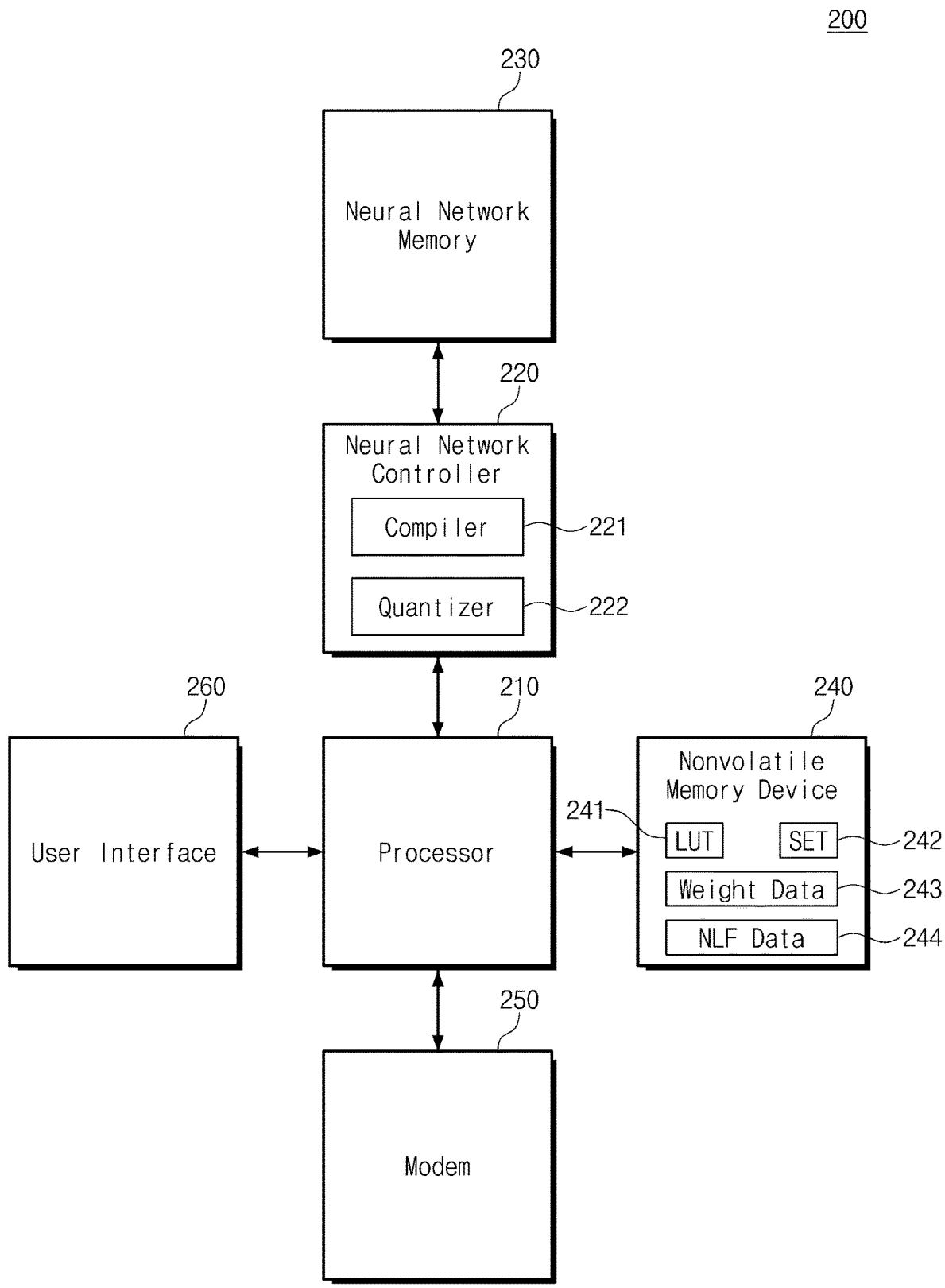
FIG. 19 illustrates a neural network system according to an embodiment.

FIG. 19 illustrates a neural network system 200 according to an embodiment. Referring to FIGS. 1, 4, and 19, the neural network system 200 may include a processor 210, a neural network controller 220, a neural network memory 230, a nonvolatile memory device 240, a modem 250, and a user interface 260.

The processor 210 may control operations of the neural network system 200 and the components of the neural network system 200. The processor 210 may execute an operating system, an application, firmware, etc. for the purpose of driving the neural network system 200. The processor 210 may include a general-purpose processor, an application processor, a microprocessor, a field programmable gate array (FPGA), an application-specific integrated circuit (ASIC), etc.

The neural network controller 220 may control the neural network memory 230 based on a request of the processor 210. For example, the neural network controller 220 may perform operations associated with each node of the neural network NN by using the neural network memory 230, based on a request of the processor 210.

The neural network controller 220 may include a compiler 221 and a quantizer 222. The compiler 221 may convert the request of the processor 210 to an address of the neural network memory 230. The quantizer 222 may identify a quantization level of data, which are stored in the neural network memory 230 in connection with the neural network NN, for example, a quantization level of weight data and non-linear function (NLF) data, and may perform quantization. For example, the quantization level may be set by a user of the neural network system 200 or may be automatically determined by the processor 210.

The neural network memory 230 may perform operations associated with each node of the neural network NN under control of the neural network controller 220. For example, the neural network memory 230 may include the semiconductor memory device 100 described with reference to FIG. 1, and may be configured and operate as described with reference to FIGS. 1 to 18.

Depending on a request of the processor 210, the nonvolatile memory device 240 may store data or may provide data stored therein. The nonvolatile memory device 240 may include a read only memory (ROM), an electrically programmable ROM (EPROM), an electrically erasable and programmable ROM (EEPROM), a flash memory, a phase-change random access memory (PRAM), a magnetic RAM (MRAM), a resistive RAM (RRAM), a ferroelectric RAM (FRAM), etc.

The nonvolatile memory device 240 may store a lookup table 241 (LUT), a setting table 242 (SET), weight data 243, and non-linear function (NLF) data 244. The lookup table 241 may be used for the compiler 221 of the neural network controller 220 to convert a request of the processor 210 to an address of the neural network memory 230.

The setting table 242 may be used for the neural network controller 220 to set (or program) the encoder block 183 of the neural network memory 230. The weight data 243 may be stored in the first memory cells 111 of the neural network memory 230. The non-linear function (NLF) data 244 may be stored in the second memory cells 112 of the neural network memory 230.

The modem 250 may communicate with an external device based on a request of the processor 210. For example, the modem 250 may exchange data with the external device wirelessly or wiredly in compliance with a wireless communication protocol or a wired communication protocol. For example, the modem 250 may receive data for an operation of the neural network NN from the external device or may transmit a result of operations of the neural network NN to the external device.

The user interface 260 may exchange information with an external environment or a user. The user interface 260 may include various input interfaces such as a camera, a microphone, a keyboard, a mouse, a touch pad, a touch panel, and a sensor. Also, the user interface 260 may include various output interfaces such as a speaker, a monitor, a beam projector, a lamp, and a vibration motor.

The neural network system 200 may perform various operations associated with the neural network NN by using the neural network memory 230 in various environments. When power is supplied to the neural network system 200, the neural network system 200 may load information or data stored in the nonvolatile memory device 240 onto the neural network controller 220 and the neural network memory 230.

For example, the lookup table 241 stored in the nonvolatile memory device 240 may be loaded onto the compiler 221 of the neural network controller 220. The lookup table 241 may map request formats of the processor 210 onto addresses of the neural network memory 230.

For example, a format of a request which the processor 210 provides to the neural network controller 220 may include an indicator indicating a specific path of a specific node in the neural network NN. The compiler 221 may convert the indicator from the processor 210 to an address of memory cells where weight data of a weight associated with the specific path of the specific node are stored. The compiler 221 may provide a command and the converted address to the neural network memory 230 in compliance with a protocol defined between the compiler 221 and the neural network memory 230.

For example, the lookup table 241 may be organized in advance based on a capacity of the neural network memory 230, the number of memory cells connected to one word line of the neural network memory 230, locations of the neural network memory 230, at which the weight data 243 and the non-linear function (NLF) data 244 are stored, and may be stored in the nonvolatile memory device 240.

The setting table 242 (SET) stored in the nonvolatile memory device 240 may be provided to the neural network controller 220. The neural network controller 220 may set the encoder block 183 of the neural network memory 230 by using the setting table 242. For example, the neural network controller 220 may set the encoder block 183 through a control channel or a sideband channel different from a main channel through which data are exchanged. For another example, the neural network controller 220 may switch the main channel, through which data are exchanged, to a setting mode, and may set the encoder block 183 through the main channel in the setting mode.

The weight data 243 and the non-linear function (NLF) data 244 stored in the nonvolatile memory device 240 may be provided to the neural network controller 220. The compiler 221 of the neural network controller 220 may manage addresses of locations of the neural network memory 230, at which the weight data 243 and the non-linear function (NLF) data 244 are to be stored, by using the lookup table 241.

The neural network controller 220 may write the weight data 243 and the non-linear function (NLF) data 244 to the neural network memory 230, based on the lookup table 241 of the compiler 221. For example, based on the method of FIGS. 2 and 3, the neural network controller 220 may write the weight data 243 and the non-linear function (NLF) data 244 to the neural network memory 230.

In an embodiment, upon writing the weight data 243 and the non-linear function (NLF) data 244 in the neural network memory 230, the quantizer 222 may adjust a quantization level of the weight data 243 and the non-linear function (NLF) data 244. For example, based on quantization level settings, the quantizer 222 may limit the number of bits indicating each weight among the weight data 243. Also, based on the quantization level settings, the quantizer 222 may limit the number of bits indicating a value of each non-linear function (NLF) among the non-linear function (NLF) data 244.

In an embodiment, the processor 210 may read information or data stored in the nonvolatile memory device 240, and may provide the read information or data to the neural network controller 220. For another example, the processor 210 may move information or data stored in the nonvolatile memory device 240 to the neural network controller 220 through a direct memory access control (DMAC).

In an embodiment, the weight data 243 and the non-linear function (NLF) data 244 may be stored in the nonvolatile memory device 240 while maintaining a form capable of being stored in the neural network memory 230. For example, when the number of memory cells belonging to one row of the neural network memory 230 is identical to the number of memory cells belonging to one row of the nonvolatile memory device 240, the weight data 243 and the non-linear function (NLF) data 244 may be stored in the nonvolatile memory device 240 as described with reference to FIGS. 14 to 18.

When the number of memory cells belonging to one row of the nonvolatile memory device 240 is two times the number of memory cells belonging to one row of the neural network memory 230, data of two rows of the memory cell array 110 described with reference to FIG. 15 may be sequentially stored at one row of the nonvolatile memory device 240.

That is, the weight data 243 and the non-linear function (NLF) data 244 may be organized in the neural network memory 230 as described with reference to FIGS. 14 to 18 by sequentially reading the weight data 243 and the non-linear function (NLF) data 244 from the nonvolatile memory device 240 and sequentially writing the read data in the neural network memory 230.

In an embodiment, the weight data 243 may be organized such that input weights of one node of the neural network NN are stored at one row of the neural network memory 230. After the weight data 243 and the non-linear function (NLF) data 244 are stored in the neural network memory 230, the neural network system 200 may perform operations associated with the neural network NN.

For example, the processor 210 may use data received through the modem 250 or the user interface 260 as an operation target of the neural network NN. The processor 210 may provide the data received from the modem 250 or the user interface 260 to the neural network controller 220 along with an appropriate request for requesting operations of the neural network NN and an indicator.

The neural network controller 220 may convert the indicator to an address of the neural network memory 230. As described with reference to FIGS. 5 to 9, the neural network controller 220 may provide data from the processor 210 to the neural network memory 230, along with an appropriate command for requesting the operations of the neural network NN and an address.

As described with reference to FIGS. 7 and 8 or FIG. 10, the neural network controller 220 may receive a result of the operations of the neural network NN from the neural network memory 230. The processor 210 may provide the result of the operations of the neural network NN received from the neural network controller 220 to the external environment through the user interface 260 or may transmit the result to the external device through the modem 250.

For example, the neural network system 200 may be a closed circuit television. The neural network system 200 may obtain an image of the external environment through the camera of the user interface 260. The processor 210 may provide the image of the external environment to the neural network controller 220.

The neural network controller 220 may perform the operations of the neural network NN on the image of the external environment by providing data of the image of the external environment to the neural network memory 230 along with commands and addresses. The neural network controller 220 may receive the result of the operations of the neural network NN from the neural network memory 230, based on the method of FIGS. 7 and 8 or FIG. 10.

The processor 210 may receive the result of the operations of the neural network NN from the neural network controller 220. When the result of the operations of the neural network NN indicates an intruder, the processor 210 may transmit an alarm signal to the external device. When the result of the operations of the neural network NN indicates a resident, the processor 210 may transmit a signal indicating whether to open or close a door, to the external device. For another example, the processor 210 may provide the result of the operations of the neural network NN to the external device without processing the result of the operations of the neural network NN.

Figure 20:
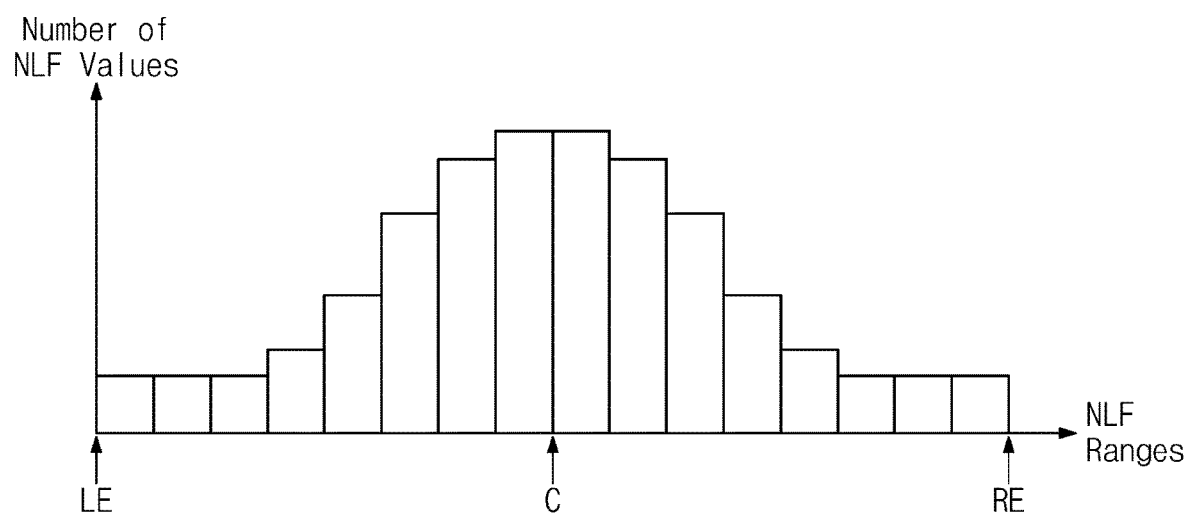
FIG. 20 illustrates an example in which a quantizer quantizes non-linear function data.

FIG. 20 illustrates an example in which the quantizer 222 quantizes non-linear function (NLF) data. In FIG. 20, a horizontal axis represents a range of values of non-linear function (NLF) data, and a vertical axis represents the number of values of non-linear function (NLF) data corresponding to each range.

Referring to FIG. 20, values of non-linear function (NLF) data may be divided into ranges of an equal interval. That is, a difference between a maximum value and a minimum value of the values of the non-linear function (NLF) data included in each range may be uniform.

As it goes toward the center "C" of ranges of non-linear function (NLF) data, the number of values of non-linear function (NLF) data included in each range may increase. That is, as it goes toward the center "C" of the ranges of the non-linear function (NLF) data, the values of the non-linear function (NLF) data may be expressed with a higher resolution.

As it goes toward a left edge LE and a right edge RE of ranges of non-linear function (NLF) data, the number of values of non-linear function (NLF) data included in each range may decrease. That is, as it goes toward the left edge LE and the right edge RE of the ranges of the non-linear function (NLF) data, the values of the non-linear function (NLF) data may be expressed with a lower resolution.

Figure 21:
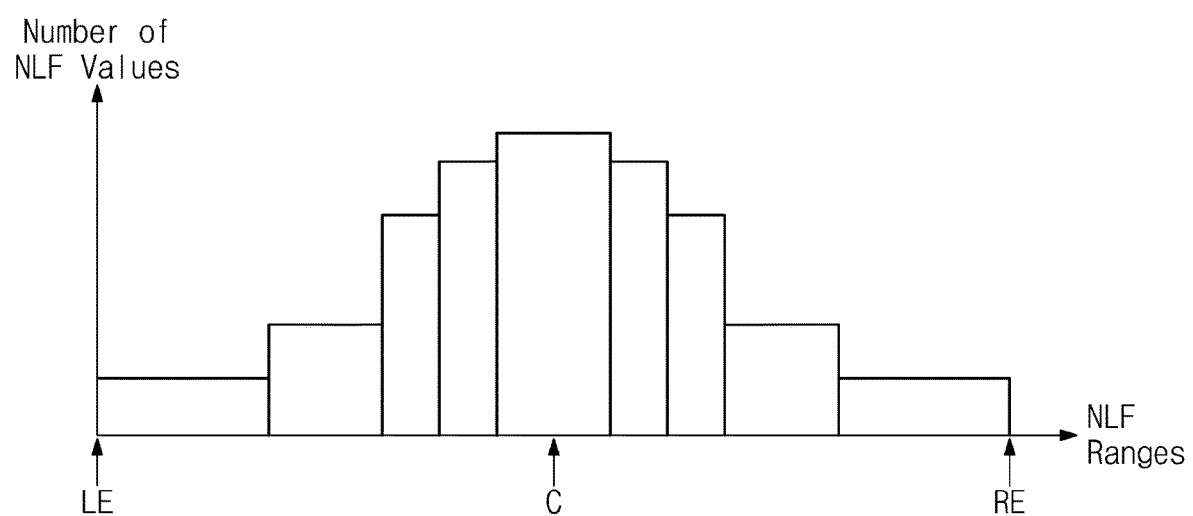
FIG. 21 illustrates another example in which a quantizer quantizes non-linear function data.

FIG. 21 illustrates another example in which the quantizer 222 quantizes non-linear function (NLF) data. In FIG. 21, a horizontal axis represents a range of values of non-linear function (NLF) data, and a vertical axis represents the number of values of non-linear function (NLF) data corresponding to each range.

Referring to FIG. 21, values of non-linear function (NLF) data may be divided into ranges of different intervals. That is, a difference between a maximum value and a minimum value of the values of the non-linear function (NLF) data included in each range may not be uniform.

For example, compared to FIG. 20, intervals of ranges close to the left edge LE and the right edge RE increase, and thus, the number of values of non-linear function (NLF) data included in each range decreases. That is, a resolution of values of non-linear function (NLF) data decreases.

For example, compared to FIG. 20, an interval of a range corresponding to the center "C" increases, and thus, the number of values of non-linear function (NLF) data included in the range corresponding to the center "C" decreases. That is, a resolution of values of non-linear function (NLF) data decreases.

The quantization illustrated in FIG. 21 may be advantageous to express an activation function such as a sigmoid function or a hyperbolic tangent function, in which a change of values of non-linear function at the center "C", the left edge LE, and the right edge RE is relatively small.

Figure 22:
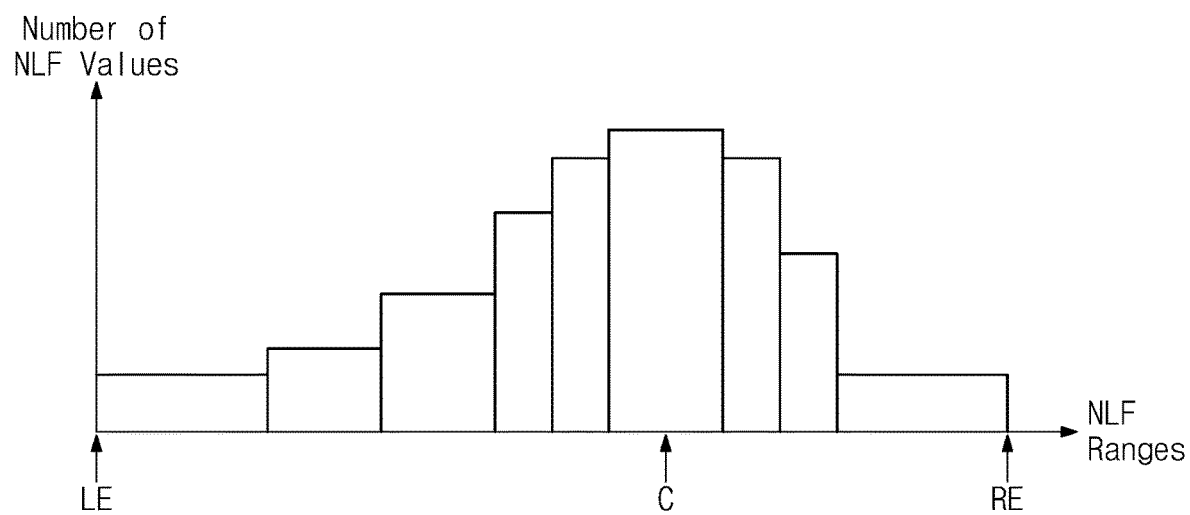
FIG. 22 illustrates another example in which a quantizer quantizes non-linear function data.

FIG. 22 illustrates another example in which the quantizer 222 quantizes non-linear function (NLF) data. In FIG. 22, a horizontal axis represents a range of values of non-linear function (NLF) data, and a vertical axis represents the number of values of non-linear function (NLF) data corresponding to each range.

Referring to FIG. 22, compared to FIG. 20, the center "C" may be closer to the right edge RE than to the left edge LE. Values of non-linear function (NLF) data may be divided into ranges of different intervals. That is, a difference between a maximum value and a minimum value of the values of the non-linear function (NLF) data included in each range may not be uniform.

For example, compared to FIG. 20, intervals of ranges close to the left edge LE and the right edge RE increase, and thus, the number of values of non-linear function (NLF) data included in each range decreases. That is, a resolution of values of non-linear function (NLF) data decreases.

For example, compared to FIG. 20, an interval of a range corresponding to the center "C" increases, and thus, the number of values of non-linear function (NLF) data included in the range corresponding to the center "C" decreases. That is, a resolution of values of non-linear function (NLF) data decreases.

In an embodiment, the quantization illustrated in FIG. 22 may be similar to the quantization illustrated in FIG. 21 except for the center "C" moves to be closer to the right edge "RE". In an embodiment, the quantization illustrated in FIG. 22 may be advantageous to express an activation function such as a rectifier linear unit (ReLU) function or an application of the ReLu, in which a change of values of non-linear function at the center "C", the left edge LE, and the right edge RE with a biased center "C" is relatively small.

Figure 23:
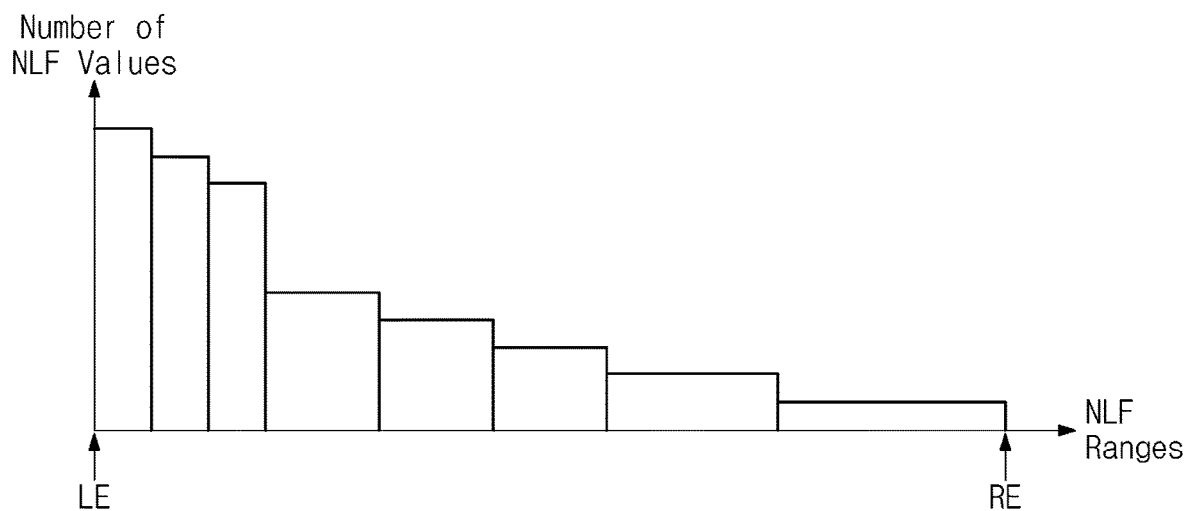
FIG. 23 illustrates another example in which a quantizer quantizes non-linear function data.

FIG. 23 illustrates another example in which the quantizer 222 quantizes non-linear function (NLF) data. In FIG. 23, a horizontal axis represents a range of values of non-linear function (NLF) data, and a vertical axis represents the number of values of non-linear function (NLF) data corresponding to each range.

Referring to FIG. 23, as it goes toward the left edge LE, a size of each range may decrease. Also, as it goes toward the left edge LE, the number of values of non-linear function (NLF) data included in each range may increase. That is, as it goes toward the left edge LE, values of non-linear function (NLF) data are expressed with a higher resolution.

Also, as it goes toward the right edge RE, a size of each range may increase. As it goes toward the right edge RE, the number of values of non-linear function (NLF) data included in each range may decrease. That is, as it goes toward the right edge RE, values of non-linear function (NLF) data are expressed with a lower resolution.

In an embodiment, the quantization illustrated in FIG. 23 may be advantageous to express an activation function such as a square root function, in which a change of values of the non-linear function (NLF) is great as it goes toward the left edge LE and a change of values of the non-linear function (NLF) is small as it goes toward the right edge RE.

As described with reference to FIGS. 20 to 23, the quantizer 222 according to an embodiment may quantize values of non-linear function (NLF) data in various schemes. When the non-linear function (NLF) data include data of two or more types of non-linear function, the quantizer 222 may apply different quantization schemes to data of different non-linear functions.

To this end, the setting table 242 may provide different settings to data of different non-linear functions. When the offset OFF is received, the encoder block 183 of the semiconductor memory device 100 may apply different settings to generate the encoded address ADDRe.

An example in which the quantizer 222 quantizes the non-linear function (NLF) data 244 is described with reference to FIGS. 20 to 23. However, the quantizer 222 may also quantize the weight data 243 as well as the non-linear function (NLF) data 244.

For example, ranges of the weight data 243 may be formed at an equal interval. Each range of the weight data 243 may have the same number of values. That is, the quantizer 222 may quantize the weight data 243 with the same resolution in the whole range of values of the weight data 243.

According to embodiments, the semiconductor memory device 100 forming the neural network memory 230 may support various non-linear functions such as sigmoid, hyper tangent, and square root, as well as linear functions such as neural network (NN) based multiplication and accumulation.

Accordingly, operations associated with each node of the neural network NN are completely performed in the neural network memory 230, and a frequency of data communication necessary between the neural network memory 230 and the processor 210 or between the neural network controller 220 and the processor 210 upon performing an operation of the neural network NN decreases. That is, a saving of resources of the processor 210 may be possible.

Also, according to an embodiment, an address at which data associated with each node of the neural network NN are stored is generated by the compiler 221 of the neural network controller 220. Accordingly, hardware, which occupies a large area, such as a ternary contents addressable memory (TCAM) is omitted, and the area of the neural network system 200 decreases.

Also, according to an embodiment, the weight data 243 and the non-linear function (NLF) data 244 stored in the neural network memory 230 may be quantized in various schemes. Accordingly, the neural network system 200 is provided which improves a performance by adaptively coping with a kind of neural network NN and a kind of an activation function used in the neural network NN.

As described above, components of the semiconductor memory device 100 and the neural network system 200 are described by using the terms "first", "second", "third", and the like. However, the terms "first", "second", "third", and the like may be used to distinguish components from each other and do not limit the inventive concept. For example, the terms "first", "second", "third", and the like do not involve an order or a numerical meaning of any form.

In the above embodiments, components according to embodiments are described by using blocks. The blocks may be implemented with various hardware devices, such as an integrated circuit, an application specific IC (ASCI), a field programmable gate array (FPGA), and a complex programmable logic device (CPLD), firmware driven in hardware devices, software such as an application, or a combination of a hardware device and software. Also, the blocks may include circuits or intellectual property (IP) implemented with semiconductor elements in an integrated circuit. Two or more of these components or blocks may be combined into one single component or block which performs all operations or functions of the combined two or more components or blocks. Also, at least part of functions of at least one of these components or blocks may be performed by another of these components or blocks.

According to the inventive concept, an accumulation sum associated with results of multiplying pieces of input data by weights is obtained in a semiconductor memory device, and a result of applying an activation function being a non-linear function to a result of the accumulation sum is obtained in the semiconductor memory device. Accordingly, a semiconductor memory device supporting machine learning-based operations while minimizing a traffic associated with data communication with an external device and an operating method of the semiconductor memory device are provided.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A semiconductor memory device comprising:
   a memory cell array comprising first memory cells and second memory cells; and
   a peripheral circuit,
   wherein the peripheral circuit is configured to:
      in response to receiving a first command, a first address, and first input data, read first data from the first memory cells, based on the first address; and
      perform a first operation by using the first data and the first input data;
      in response to receiving a second command after performing the first operation, convert a result of the first operation to a second address; and
      read second data from the second memory cells, based on the second address.

2. The semiconductor memory device of claim 1, wherein the first operation is performed by applying the first data to the first input data and accumulating a result of the applying.

3. The semiconductor memory device of claim 1, wherein the peripheral circuit is further configured to select a part of all bits constituting the result of the first operation as the second address.

4. The semiconductor memory device of claim 1, wherein the peripheral circuit is further configured to, in response to receiving the second command and an offset after performing the first operation;
   convert the result of the first operation and the offset to the second address; and
   read the second data from the second memory cells, based on the second address.

5. The semiconductor memory device of claim 4, wherein the offset is received as an address or data along with the second command.

6. The semiconductor memory device of claim 1, wherein the peripheral circuit is further configured to, in response to receiving a third command after reading the second data, output the second data.

7. The semiconductor memory device of claim 1, wherein the memory cell array comprises a plurality of word lines and a plurality of bit lines, and
   wherein all of the first data are stored in memory cells disposed in a same word line.

8. The semiconductor memory device of claim 1, wherein the peripheral circuit is further configured to:
   when the first command is further received together with the second address and second input data after performing the first operation, read third data from the first memory cells, based on the second address;
   perform a second operation by using the third data and the second input data;
   accumulate a result of performing the second operation and the result of the first operation; and
   read the second data from the second memory cells by using the result of performing the second operation and the result of the first operation that are accumulated.

9. The semiconductor memory device of claim 1, wherein the memory cell array comprises a plurality of word lines and a plurality of bit lines, and
   wherein at least some of the first data and at least some of the second data are stored in memory cells disposed in a same word line.

10. The semiconductor memory device of claim 1, wherein the peripheral circuit is further configured to,
   in response to receiving the second command and the second address after reading the second data, read third data from the first memory cells, based on the second address;
   perform a second operation by using the third data and the second data; and
   read fourth data from the second memory cells by using a result of the second operation.

11. The semiconductor memory device of claim 1, wherein the peripheral circuit is further configured to, in response to receiving the second command, the second address, and third data before the receiving the first command, write the third data in the first memory cells and/or the second memory cells, based on the second address.

12. A semiconductor memory device comprising:
a memory cell array comprising first memory cells and second memory cells;
a row decoder block connected with the memory cell array through word lines;
a write and sense block connected to the memory cell array through bit lines; and
an operation block,
wherein the second memory cells include first sub memory cells connected to a first word line of the word lines and second sub memory cells connected to a second word line of the word lines,
wherein, in response to receiving a first command, a first address, and first input data, the row decoder block and the write and sense block read first data from the first memory cells, based on the first address,
wherein the operation block applies the first data to the first input data to output third data, and
wherein, in response to receiving a second command, the row decoder block and the write and sense block read second data from the first sub memory cells or the second sub memory cells, based on the third data.

13. The semiconductor memory device of claim 12, wherein the row decoder block and the write and sense block read the second data from the first sub memory cells or the second sub memory cells, based on an offset received along with the second command.

14. The semiconductor memory device of claim 12, wherein the second memory cells include third sub memory cells and fourth sub memory cells connected to one line of the word lines, and
wherein the row decoder block and the write and sense block read the second data from the third sub memory cells or the fourth sub memory cells, based on an offset received along with the second command.

15. The semiconductor memory device of claim 12, wherein each of the word lines is connected to a corresponding part to the first memory cells and a corresponding part of the second memory cells.

16. The semiconductor memory device of claim 12, wherein one of the word lines is connected to a corresponding part of the first memory cells and to the second memory cells, and
wherein another one of the word lines are connected to remaining part of the first memory cells.

17. An operating method of a semiconductor memory device that comprises first memory cells and second memory cells, the method comprising:
receiving a first command, a first address, and first input data;
in response to the first command, the first address, and the first input data being received, reading first data from the first memory cells, based on the first address;
performing an operation on the first data and the first input data;
receiving a second command after performing the operation;
in response to the second command being received, converting a result of the operation to a second address, and
reading second data from the second memory cells, based on the second address.

18. The method of claim 17, wherein the first data correspond to a weight of a neural network, and
wherein the second data correspond to a result obtained by applying an activation function to the result of the operation.

* * * * *